United States Patent
Jeong et al.

(10) Patent No.: US 11,735,231 B2
(45) Date of Patent: *Aug. 22, 2023

(54) MEMORY DEVICES

(71) Applicant: Samsung Electronics Co., Ltd., Suwon-si (KR)

(72) Inventors: Ji-hyun Jeong, Hwaseong-si (KR); Jae-hyun Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/526,155

(22) Filed: Nov. 15, 2021

(65) Prior Publication Data

US 2022/0076713 A1   Mar. 10, 2022

Related U.S. Application Data

(63) Continuation of application No. 17/143,340, filed on Jan. 7, 2021, now Pat. No. 11,183,223, which is a (Continued)

(30) Foreign Application Priority Data

Dec. 1, 2017   (KR) .................. 10-2017-0164331

(51) Int. Cl.
*G11C 16/04*  (2006.01)
*G11C 5/06*   (2006.01)
(Continued)

(52) U.S. Cl.
CPC ............. *G11C 5/063* (2013.01); *G11C 5/025* (2013.01); *G11C 13/0023* (2013.01);
(Continued)

(58) Field of Classification Search
CPC ............ G11C 13/0026; G11C 13/0028; G11C 2213/52; G11C 2213/75
See application file for complete search history.

(56) References Cited

U.S. PATENT DOCUMENTS 5,392,238 A * 2/1995 Kirisawa ............ G11C 16/0491
                                                        365/72
7,646,664 B2    1/2010 Cho et al.
(Continued)

FOREIGN PATENT DOCUMENTS

CN      106688097 A    5/2017
JP      2007165873 A   6/2007
(Continued)

*Primary Examiner* — Pho M Luu
(74) *Attorney, Agent, or Firm* — Myers Bigel, P.A.

(57) ABSTRACT

A memory device includes a first cell block on a substrate at a first level, and a second cell block on the substrate at a second level different from the first level. Each of the first and second cell blocks includes a word line extending in a first direction that is parallel to a top surface of the substrate, a word line contact connected to a center point of the word line, a bit line extending in a second direction that is parallel to the top surface of the substrate and intersects the first direction, a bit line contact connected to a center point of the bit line, and a memory cell between the word and bit lines. The second cell block is offset from the first cell block in at least one of the first and second directions.

20 Claims, 24 Drawing Sheets

Related U.S. Application Data continuation of application No. 16/869,804, filed on May 8, 2020, now Pat. No. 10,923,162, which is a continuation of application No. 16/168,153, filed on Oct. 23, 2018, now Pat. No. 10,685,682.

(51) Int. Cl.

| | | |
|---|---|---|
| *G11C 5/02* | (2006.01) | |
| *G11C 13/00* | (2006.01) | |
| *H10B 61/00* | (2023.01) | |
| *H10B 63/00* | (2023.01) | |
| *H10N 70/20* | (2023.01) | |
| *H10N 70/00* | (2023.01) | |

(52) U.S. Cl.
CPC ...... *G11C 13/0026* (2013.01); *G11C 13/0028* (2013.01); *H10B 61/10* (2023.02); *H10B 61/22* (2023.02); *H10B 63/24* (2023.02); *H10B 63/84* (2023.02); *G11C 2213/52* (2013.01); *G11C 2213/71* (2013.01); *G11C 2213/75* (2013.01); *H10N 70/20* (2023.02); *H10N 70/231* (2023.02); *H10N 70/826* (2023.02); *H10N 70/8413* (2023.02); *H10N 70/8828* (2023.02); *H10N 70/8833* (2023.02)

(56) References Cited

U.S. PATENT DOCUMENTS

| 7,816,189 | B2 | 10/2010 | Subramanian et al. |
|---|---|---|---|
| 7,889,538 | B2 | 2/2011 | Toda |
| 8,044,456 | B2 | 10/2011 | Nagashima et al. |
| 8,097,903 | B2 | 1/2012 | Inaba et al. |
| 8,206,305 | B2 * | 6/2012 | Garbini ............... G01S 15/8929 29/25.35 |
| 8,208,305 | B2 | 6/2012 | Tanzawa |
| 8,395,922 | B2 | 3/2013 | Noguchi et al. |
| 8,437,162 | B2 | 5/2013 | Maejima |
| 8,611,121 | B2 | 12/2013 | Ahn et al. |
| 9,378,774 | B2 | 6/2016 | Castro et al. |
| 10,115,669 | B2 | 10/2018 | Terada et al. |
| 10,685,682 | B2 * | 6/2020 | Jeong .................... G11C 5/063 |
| 10,902,913 | B2 | 1/2021 | Terada |
| 10,923,163 | B2 * | 2/2021 | Sakui .................... G11C 16/26 |
| 11,183,223 | B2 * | 11/2021 | Jeong .................... H01L 27/228 |
| 2002/0018355 | A1 | 2/2002 | Johnson et al. |
| 2007/0132049 | A1 | 6/2007 | Stipe |
| 2009/0174032 | A1 | 7/2009 | Maejima et al. |
| 2010/0187591 | A1 | 7/2010 | Nagashima |
| 2017/0294375 | A1 | 10/2017 | Terada et al. |
| 2019/0172502 | A1 | 6/2019 | Jeong et al. |

FOREIGN PATENT DOCUMENTS

| JP | 2009224610 A | 10/2009 |
|---|---|---|
| JP | 2010263211 A | 11/2010 |
| JP | 5085446 B2 | 11/2012 |
| JP | 5550239 B2 | 7/2014 |
| JP | 2018200738 A | 12/2018 |
| KR | 101128246 B1 | 4/2012 |
| KR | 1020170057254 A | 5/2017 |

\* cited by examiner

MEMORY DEVICES

CROSS-REFERENCE TO RELATED APPLICATION

This application is a continuation of U.S. patent application Ser. No. 17/143,340, filed Jan. 7, 2021, now U.S. Pat. No. 11,183,223, which is a continuation of U.S. patent application Ser. No. 16/869,804, filed May 8, 2020, now U.S. Pat. No. 10,923,162, which is a continuation of U.S. patent application Ser. No. 16/168,153, filed Oct. 23, 2018, now U.S. Pat. No. 10,685,682, which claims the benefit of Korean Patent Application No. 10-2017-0164331, filed on Dec. 1, 2017, in the Korean Intellectual Property Office, the disclosures of which are incorporated herein in their entireties by reference.

BACKGROUND

The inventive concept relates to memory devices, and, more particularly, to memory devices having a cross point array structure.

As electronic products become smaller with reduced weights, thicknesses, and sizes, the demand for high integration densities of memory devices may increase. High integration density memory devices may use a three-dimensional (3D) cross point structure in which memory cells are provided at cross points between two electrodes. When memory devices are stacked in two or more layers, a wiring resistance or an area of a wiring connection region of the memory devices may increase.

SUMMARY

Embodiments of the inventive concept may provide a cross-point-array memory device having a relatively low wiring resistance and a relatively compact size.

According to some embodiments of the inventive concept, there is provided a memory device including a first cell block on a substrate at a first level, and a second cell block on the substrate at a second level different from the first level, wherein each of the first and second cell blocks includes a word line extending in a first direction that is parallel to a top surface of the substrate, a word line contact connected to a center point of the word line, a bit line extending in a second direction that is parallel to the top surface of the substrate and intersects the first direction, a bit line contact connected to a center point of the bit line, and a memory cell between the word line and the bit line, and wherein the second cell block is offset from the first cell block in at least one of the first and second directions.

According to other embodiments of the inventive concept, there is provided a memory device including a first cell block on a substrate, a second cell block on the first cell block, a third cell block on the second cell block, and a fourth cell block on the third cell block, wherein each of the first to fourth cell blocks includes a word line extending in a first direction that is parallel to a top surface of the substrate, a word line contact connected to a center point of the word line, a bit line extending in a second direction that is parallel to the top surface of the substrate and intersects the first direction, a bit line contact connected to a center point of the bit line, and a memory cell between the word line and the bit line, and wherein at least one of the first to fourth cell blocks is offset from another of the first to fourth cell blocks in at least one of the first and second directions.

According to further embodiments of the inventive concept, there is provided a memory device including a first cell block on a substrate at a first level, a second cell block on the substrate at a second level different from the first level, a third cell block on the substrate at a third level different from the first and second levels, and a fourth cell block on the substrate at a fourth level different from the first to third levels, wherein each of the first to fourth cell blocks includes a first sub cell array region and a second sub cell array region spaced apart from each other in a first direction that is parallel to a top surface of the substrate, and a third sub cell array region and a fourth sub cell array region respectively spaced apart from the first and second sub cell array regions in a second direction that intersects the first direction, and wherein the first to fourth cell blocks are offset from each other in at least one of the first and second directions.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the attached drawings.

Like reference numbers signify like elements throughout the description of the figures. It is noted that aspects of the invention described with respect to one embodiment, may be incorporated in a different embodiment although not specifically described relative thereto. That is, all embodiments and/or features of any embodiment can be combined in any way and/or combination.

Some embodiments of the inventive concept stem from a realization that memory devices that include a plurality of sequentially stacked cell blocks may be interconnected via bit line contacts and/or word line contacts in which the interconnection lines are disposed outside of the footprint of the cell blocks in a plan view of the memory device. This may result in increased wiring resistance along with a larger footprint for the memory device. According to some embodiments of the inventive concept, a memory device may include a plurality of stacked cell blocks in which each cell block is offset in at least one direction from an adjacent cell block. The offset may provide pathways to run bit lines and/or word lines between the cell blocks without running lines outside the overall perimeter of the memory device when viewed in a plan view. This may reduce the overall length of the bit lines and/or word lines and, as a result, reduce wiring resistance. Improvements in electrical characteristics, such as voltage drops associated with the wiring may also be provided. Because the wiring connections for the bit lines and/or word lines are within the footprint of the cell blocks in a plan view of the memory device, the overall device footprint may be reduced.

Figure 1:
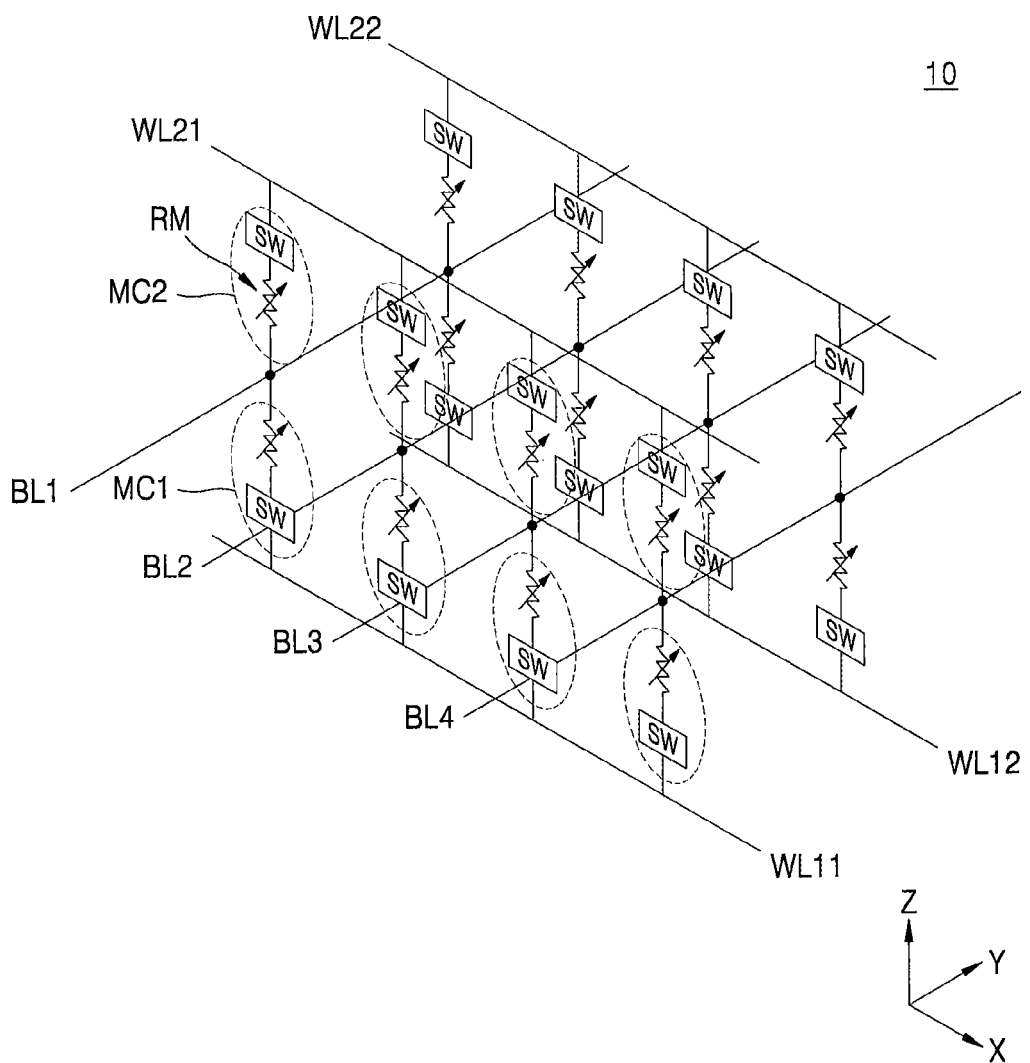
FIG. 1 is an equivalent circuit diagram of a memory device according to example embodiments of the inventive concept.

FIG. 1 is an equivalent circuit diagram of a memory device 10 according to example embodiments of the inventive concept.

Referring to FIG. 1, the memory device 10 may include lower word lines WL11 and WL12 extending in a first direction (e.g., the X direction of FIG. 1) and spaced apart from each other in a second direction perpendicular to or intersects with the first direction (e.g., the Y direction of FIG. 1), and upper word lines WL21 and WL22 provided on the lower word lines WL11 and WL12, spaced apart from the lower word lines WL11 and WL12 in a third direction perpendicular to or intersects with the first direction (e.g., the Z direction of FIG. 1), and extending in the first direction. The memory device 10 may further include bit lines BL1, BL2, BL3, and BL4 provided between the lower word lines WL11 and WL12 and the upper word lines WL21 and WL22, spaced apart from the lower word lines WL11 and WL12 and the upper word lines WL21 and WL22 in the third direction, and extending in the second direction.

First memory cells MC1 may be provided between the lower word lines WL11 and WL12 and the bit lines BL1, BL2, BL3, and BL4, and second memory cells MC2 may be provided between the bit lines BL1, BL2, BL3, and BL4 and the upper word lines WL21 and WL22. Specifically, the first and second memory cells MC1 and MC2 may include variable resistance material layers RM for storing data and switching devices SW for selecting a memory cell. The switching devices SW may also be referred to as selection devices or access devices.

In example embodiments, the first and second memory cells MC1 and MC2 may be provided to have symmetrical structures in the third direction. For example, as illustrated in FIG. 1, in the first memory cells MC1, the variable resistance material layers RM may be connected to the bit lines BL1, BL2, BL3, and BL4, the switching devices SW may be connected to the lower word lines WL11 and WL12, and the variable resistance material layers RM may be connected in series to the switching devices SW. In the second memory cells MC2, the variable resistance material layers RM may be connected to the bit lines BL1, BL2, BL3, and BL4, the switching devices SW may be connected to the upper word lines WL21 and WL22, and the variable resistance material layers RM may be connected in series to the switching devices SW.

However, embodiments of the inventive concept are not limited thereto. Unlike FIG. 1, the locations of the variable resistance material layers RM and the switching devices SW may be switched in the first and second memory cells MC1 and MC2. For example, in the first memory cells MC1, the variable resistance material layers RM may be connected to the lower word lines WL11 and WL12, and the switching devices SW may be connected to the bit lines BL1, BL2, BL3, and BL4. In the second memory cells MC2, the variable resistance material layers RM may be connected to the upper word lines WL21 and WL22, and the switching devices SW may be connected to the bit lines BL1, BL2, BL3, and BL4.

In other embodiments, the first and second memory cells MC1 and MC2 may be provided to have similar or identical structures. Unlike FIG. 1, in the first memory cells MC1, the variable resistance material layers RM may be connected to the bit lines BL1, BL2, BL3, and BL4, and the switching devices SW may be connected to the lower word lines WL11 and WL12. In the second memory cells MC2, the variable resistance material layers RM may be connected to the upper word lines WL21 and WL22, and the switching devices SW may be connected to the bit lines BL1, BL2, BL3, and BL4.

Unlike FIG. 1, additional bit lines (not shown) and additional word lines (not shown) may be further provided on the upper word lines WL21 and WL22, and additional memory cells may be further provided between the upper word lines WL21 and WL22 and the additional bit lines and between the additional bit lines and the additional word lines.

Methods of driving the memory device 10, according to some embodiments of the inventive concept, will now be described.

For example, a voltage may be applied to the variable resistance material layers RM of the first and second memory cells MC1 and MC2 through the lower and upper word lines WL11, WL12, WL21, and WL22 and the bit lines BL1, BL2, BL3, and BL4, such that a current may flow through the variable resistance material layers RM. For example, the variable resistance material layers RM may include phase change material layers capable of reversibly transitioning between a first state and a second state. Embodiments of the variable resistance material layers RM, however, are not limited thereto, and may include any variable resistor, in which a resistance value varies depending on an applied voltage applied thereto and/or a current received therethrough. For example, the resistance of the variable resistance material layers RM may reversibly transition between the first state and the second state based on the voltage applied to the variable resistance material layer RM of a selected first or second memory cell MC1 or MC2.

Based on the variation in the resistance of the variable resistance material layers RM, digital data, such as "0" or "1," may be stored in or erased from the first and second memory cells MC1 and MC2. For example, data corresponding to a high-resistance state "0" and a low-resistance state "1" may be programmed in the first and second memory cells MC1 and MC2. Herein, a program operation from the high-resistance state "0" to the low-resistance state "1" may be referred to as a "set operation," and a program operation from the low-resistance state "1" to the high-resistance state "0" may be referred to as a "reset operation." It will be understood, however, that the first and second memory cells MC1 and MC2, according to various embodiments of the inventive concept, are not limited to the above-described digital data of the high-resistance state "0" and the low-resistance state "1," and may store data based on various resistance states.

An arbitrary first or second memory cell MC1 or MC2 may be addressed by selecting one of the lower and upper word lines WL11, WL12, WL21, and WL22 and one of the bit lines BL1, BL2, BL3, and BL4, and may be programmed by applying a signal between the lower or upper word line WL11, WL12, WL21, or WL22 and the bit line BL1, BL2, BL3, or BL4, and data based on a resistance value of a variable resistor of the first or second memory cell MC1 or MC2 may be read by measuring a current value through the bit line BL1, BL2, BL3, or BL4.

According to example embodiments, the lower word lines WL11 and WL12 and the upper word lines WL21 and WL22 may be vertically spaced apart from each other by providing the bit lines BL1, BL2, BL3, and BL4 therebetween, the first memory cells MC1 may be provided between the bit lines BL1, BL2, BL3, and BL4 and the lower word lines WL11 and WL12, and the second memory cells MC2 may be provided between the bit lines BL1, BL2, BL3, and BL4 and the upper word lines WL21 and WL22. Therefore, the memory device 10, according to some embodiments of the inventive concept, may have a relatively compact size and a relatively high integration density.

Figure 2A:
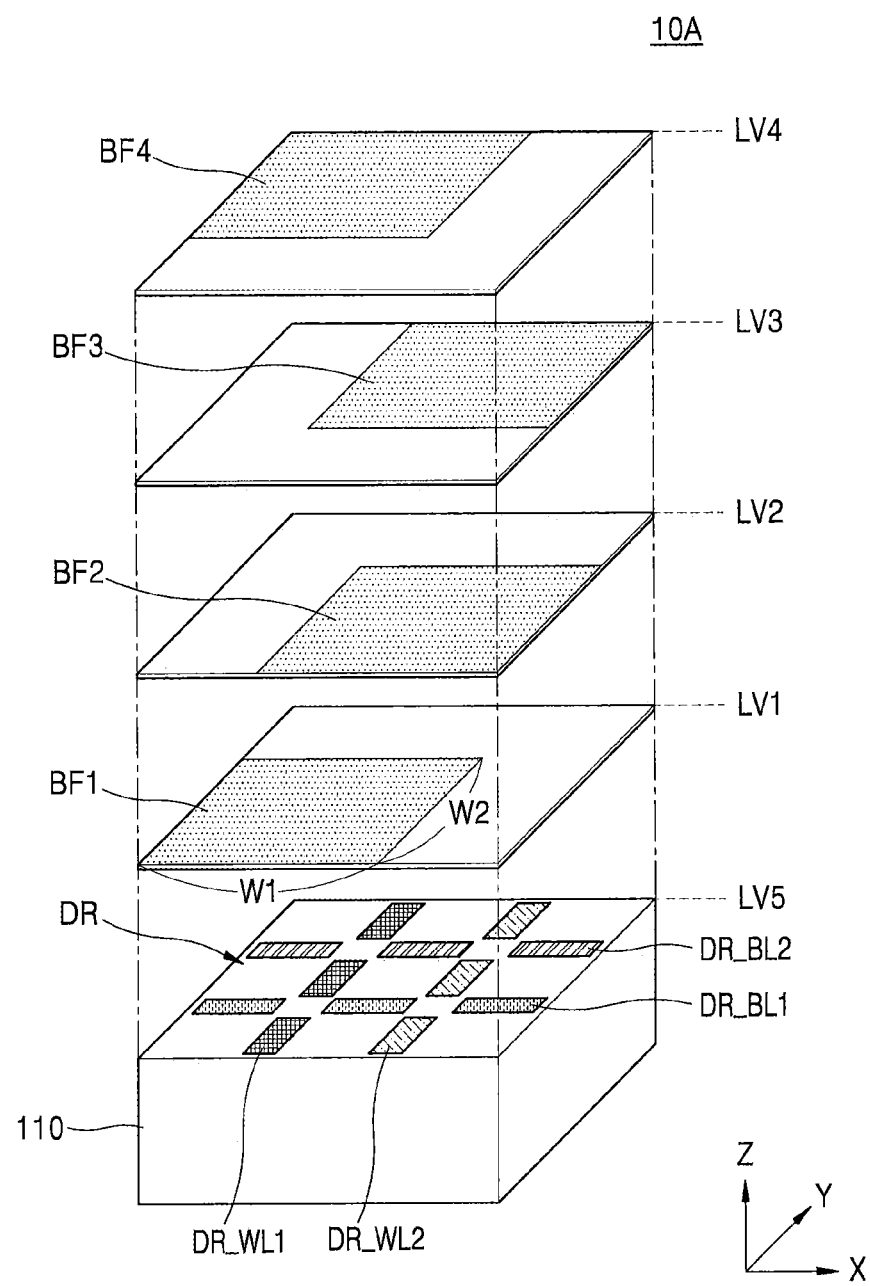
FIG. 2A is an exploded perspective view of a memory device according to example embodiments of the inventive concept.

FIG. 2A is an exploded perspective view of a memory device 10A according to example embodiments of the inventive concept.

Referring to FIG. 2A, the memory device 10A may include first to fourth cell blocks BF1, BF2, BF3, and BF4 located on a substrate 110 at different levels. Each of the first to fourth cell blocks BF1, BF2, BF3, and BF4 may include the lower word lines WL11 and WL12 (see FIG. 1), the bit lines BL1, BL2, BL3, and BL4 (see FIG. 1), and the first memory cells MC1 (see FIG. 1) provided between the lower word lines WL11 and WL12 and the bit lines BL1, BL2, BL3, and BL4, as illustrated in FIG. 1.

For example, as illustrated in FIG. 2A, the first cell block BF1 may be provided at a first level LV1 and the second cell block BF2 may be provided at a second level LV2 on the substrate 110. The second cell block BF2 may be located so as to partially overlap with the first cell block BF1. For example, the second cell block BF2 may be provided at a location shifted or offset from the first cell block BF1 in a first direction (e.g., the X direction) by ½ of a first width W1 of the first cell block BF1 in the first direction.

The third cell block BF3 may be provided at a third level LV3 on the substrate 110. The third cell block BF3 may be located so as to partially overlap with both of the first and second cell blocks BF1 and BF2. For example, the third cell block BF3 may be provided at a location shifted or offset from the first cell block BF1 in the first direction by ½ of the first width W1 of the first cell block BF1, and in a second direction (e.g., the Y direction) by ½ of a second width W2 of the first cell block BF1 in the second direction. In addition, the third cell block BF3 may be provided at a location shifted or offset from the second cell block BF2 by ½ of the second width W2 in the second direction.

The fourth cell block BF4 may be provided at a fourth level LV4 on the substrate 110. The fourth cell block BF4 may be located so as to partially overlap with all of the first to third cell blocks BF1, BF2, and BF3. For example, the fourth cell block BF4 may be provided at a location shifted or offset from the first cell block BF1 by ½ of the second width W2 in the second direction. In addition, the fourth cell block BF4 may be provided at a location shifted or offset from the third cell block BF3 by ½ of the first width W1 in the first direction.

A driving circuit region DR, including driving circuits for separately driving the first to fourth cell blocks BF1, BF2, BF3, and BF4, may be provided at a fifth level LV5 on the substrate 110. For example, a first word line driving region DR_WL1, a second word line driving region DR_WL2, a first bit line driving region DR_BL1, and a second bit line driving region DR_BL2 may be provided on the substrate 110. The driving circuits may be peripheral circuits capable of processing data input to or output from the first and second memory cells MC1 and MC2 (see FIG. 1). For example, the peripheral circuits may include page buffers, latch circuits, cache circuits, column decoders, sense amplifiers, data in/out circuits, or row decoders.

For example, as illustrated in FIG. 2A, any two of the first to fourth cell blocks BF1, BF2, BF3, and BF4 may not completely overlap with each other. As such, the driving circuit region DR provided at the fifth level LV5 on the substrate 110 may vertically overlap with the first to fourth cell blocks BF1, BF2, BF3, and BF4 respectively provided at the first to fourth levels LV1, LV2, LV3, and LV4 on the substrate 110. Any of the first word line driving region DR_WL1, the second word line driving region DR_WL2, the first bit line driving region DR_BL1, and the second bit line driving region DR_BL2 may not overlap with another. Therefore, a wiring connection structure (not shown) having a reduced or minimum length on a compact area from the first to fourth cell blocks BF1, BF2, BF3, and BF4 to the driving circuit region DR may be obtained.

In general, when cell blocks are vertically stacked in multiple layers, a wiring connection structure including bit line contacts and word line contacts used to provide electrical connection to the cell blocks may be provided outside the cell blocks (or provided to surround the cell blocks in a plan view). Particularly, when cell blocks are vertically stacked in multiple layers. Because a wiring connection structure for cell blocks of each layer is provided outside the cell blocks, an area of a wiring connection region for providing the wiring connection structure may be increased and, thus, a total chip area of a memory device may also be increased.

However, according to example embodiments, the first to fourth cell blocks BF1, BF2, BF3, and BF4 may partially overlap with each other or may be shifted or offset from each other by ½ of the first width W1 or by ½ of the second width W2. Therefore, bit line contacts and word line contacts separately connected to the first to fourth cell blocks BF1, BF2, BF3, and BF4 may be provided on regions of the substrate 110 which overlap with the first to fourth cell blocks BF1, BF2, BF3, and BF4. That is, the wiring structure, according to some embodiments of the inventive concept, may be confined to an area within a polygon defined by a plan view of the first to fourth cell blocks BF1, BF2, BF3, and BF4. As such, an area of a wiring connection region may be reduced and the memory device 10A may have a compact size.

Figure 2B:
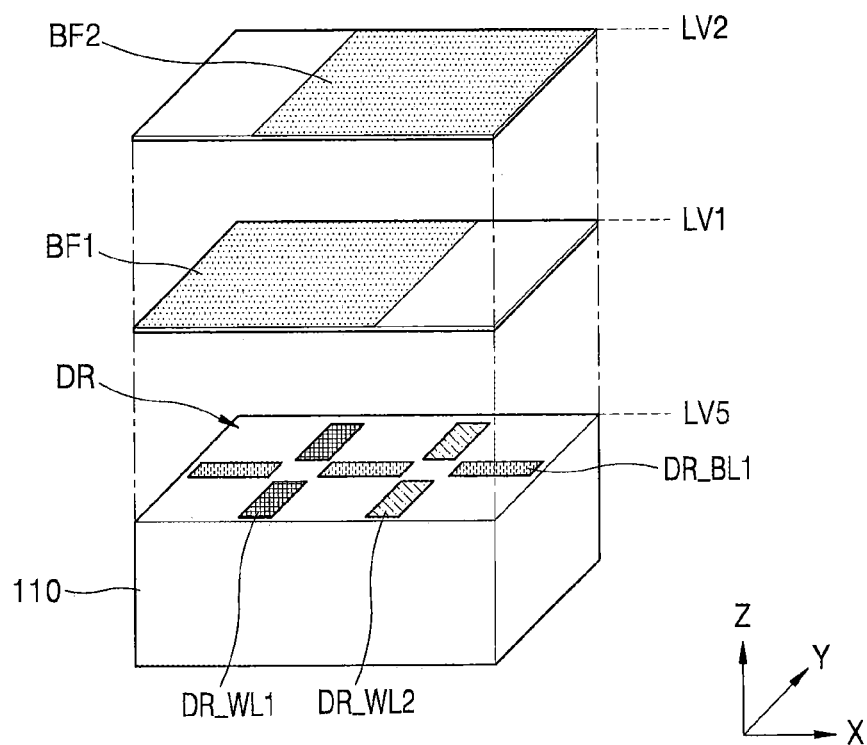
FIG. 2B is an exploded perspective view of a memory device according to further example embodiments of the inventive concept.

FIG. 2B is an exploded perspective view of a memory device 10B according to further example embodiments of the inventive concept.

Referring to FIG. 2B, the first cell block BF1 may be provided at the first level LV1 and the second cell block BF2 may be provided at the second level LV2 on the substrate 110, and the second cell block BF2 may be provided at a location shifted or offset from the first cell block BF1 in a first direction (e.g., the X direction) by ½ of the first width W1 of the first cell block BF1 in the first direction.

A driving circuit region DR, including driving circuits for separately driving the first and second cell blocks BF1 and BF2, may be provided at the fifth level LV5 on the substrate 110. For example, the first word line driving region DR_WL1, the second word line driving region DR_WL2, and the first bit line driving region DR_BL1 may be provided on the substrate 110. Both bit lines of the first cell block BF1 and bit lines of the second cell block BF2 may be electrically connected to the first bit line driving region DR_BL1.

Figure 2C:
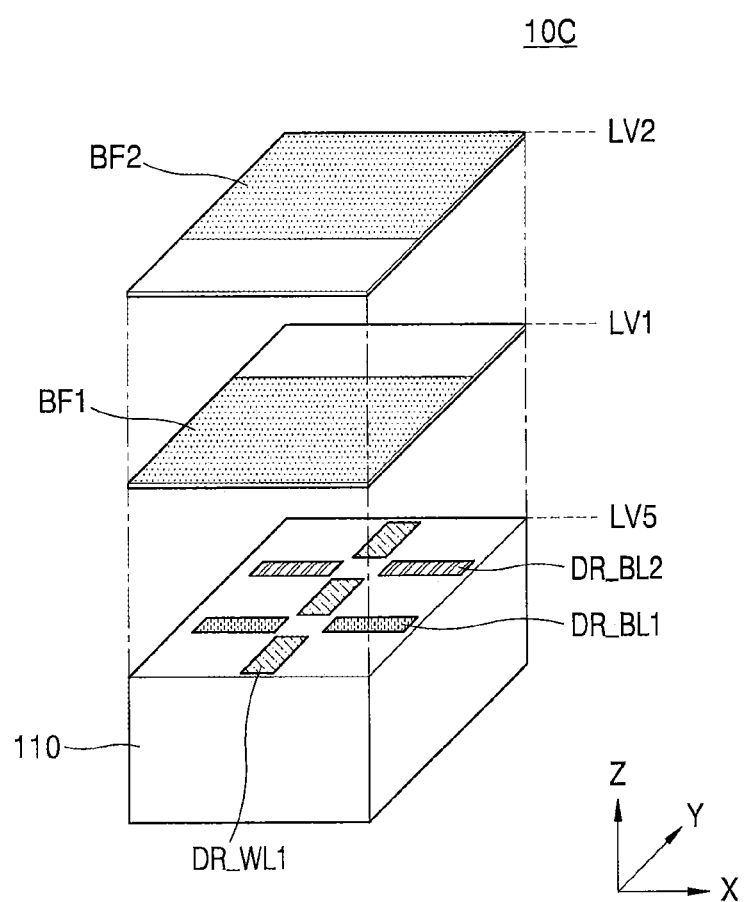
FIG. 2C is an exploded perspective view of a memory device according to further example embodiments of the inventive concept.

FIG. 2C is an exploded perspective view of a memory device 10C according to further example embodiments of the inventive concept.

Referring to FIG. 2C, the first cell block BF1 may be provided at the first level LV1 and the second cell block BF2 may be provided at the second level LV2 on the substrate 110, and the second cell block BF2 may be provided at a location shifted or offset from the first cell block BF1 in a second direction (e.g., the Y direction) by ½ of the second width W2 of the first cell block BF1 in the second direction.

A driving circuit region DR, including driving circuits for separately driving the first and second cell blocks BF1 and BF2, may be provided at the fifth level LV5 on the substrate 110. For example, the first word line driving region DR_WL1, the first bit line driving region DR_BL1, and the second bit line driving region DR_BL2 may be provided on the substrate 110. Both word lines of the first cell block BF1 and word lines of the second cell block BF2 may be electrically connected to the first word line driving region DR_WL1.

Figure 3:
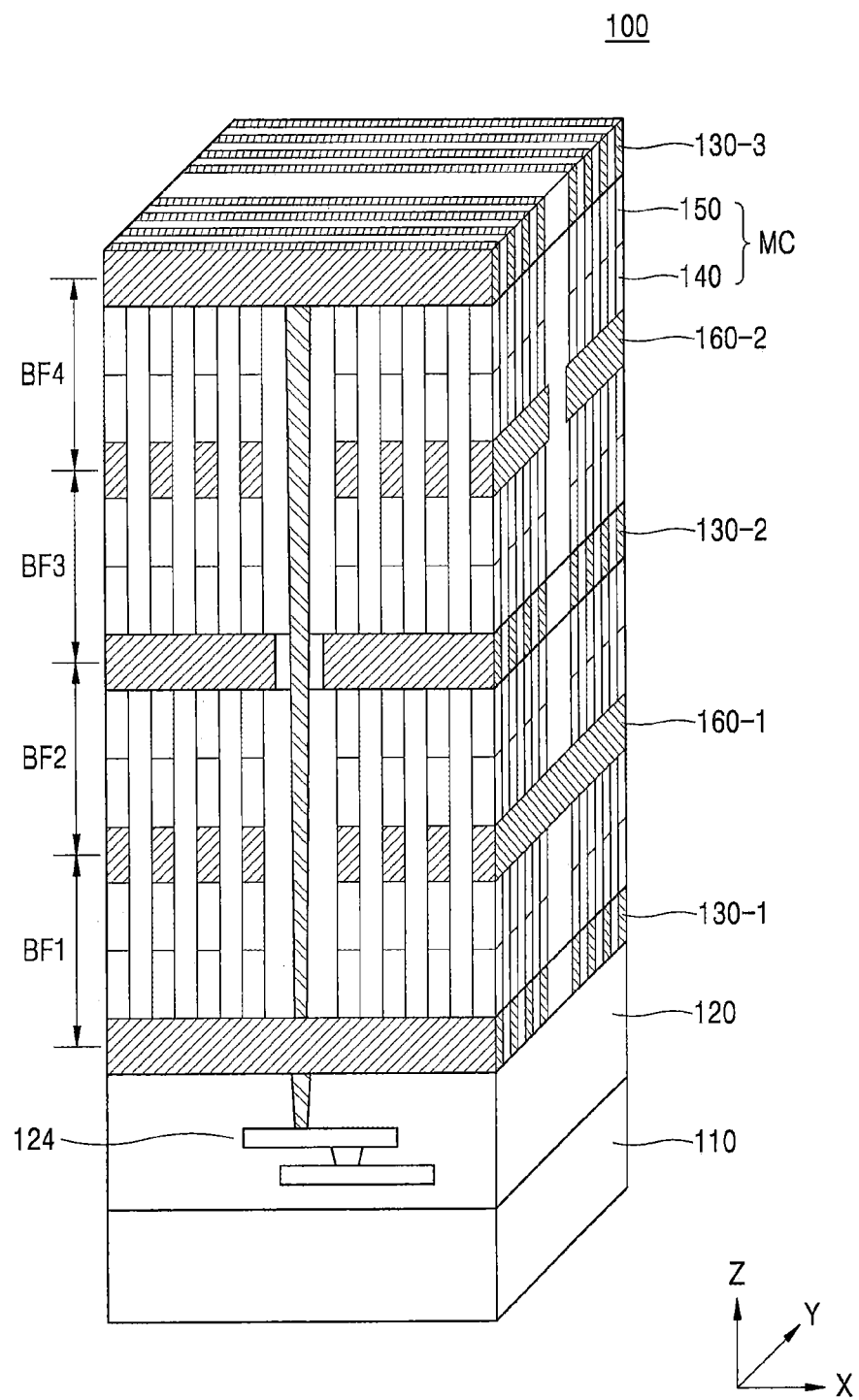
FIG. 3 is a perspective view of a memory device according to example embodiments of the inventive concept.
Figure 8:
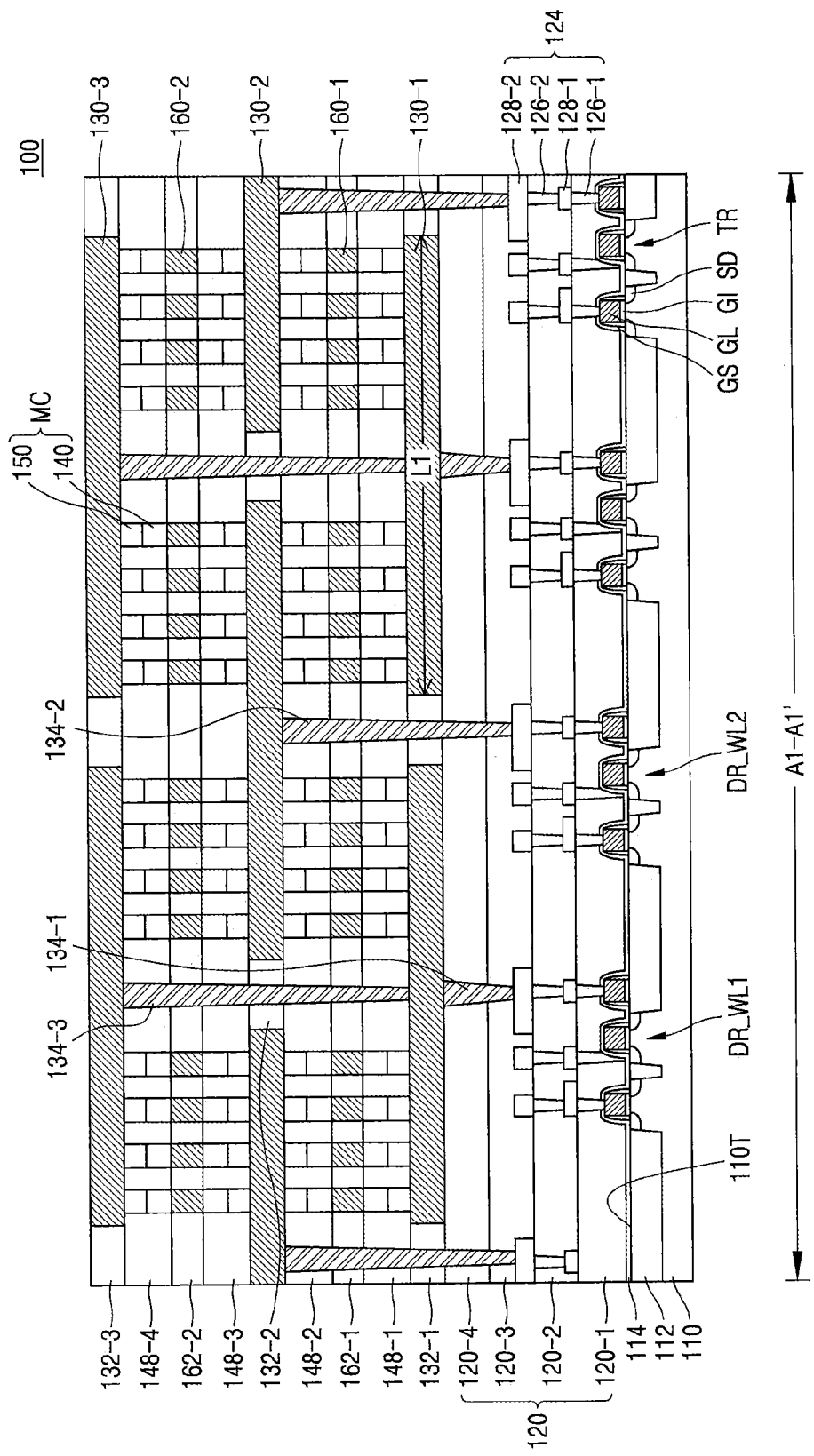
FIG. 8 is a cross-sectional view taken along line A1-A1' of FIGS. 4 to 7.
Figure 9:
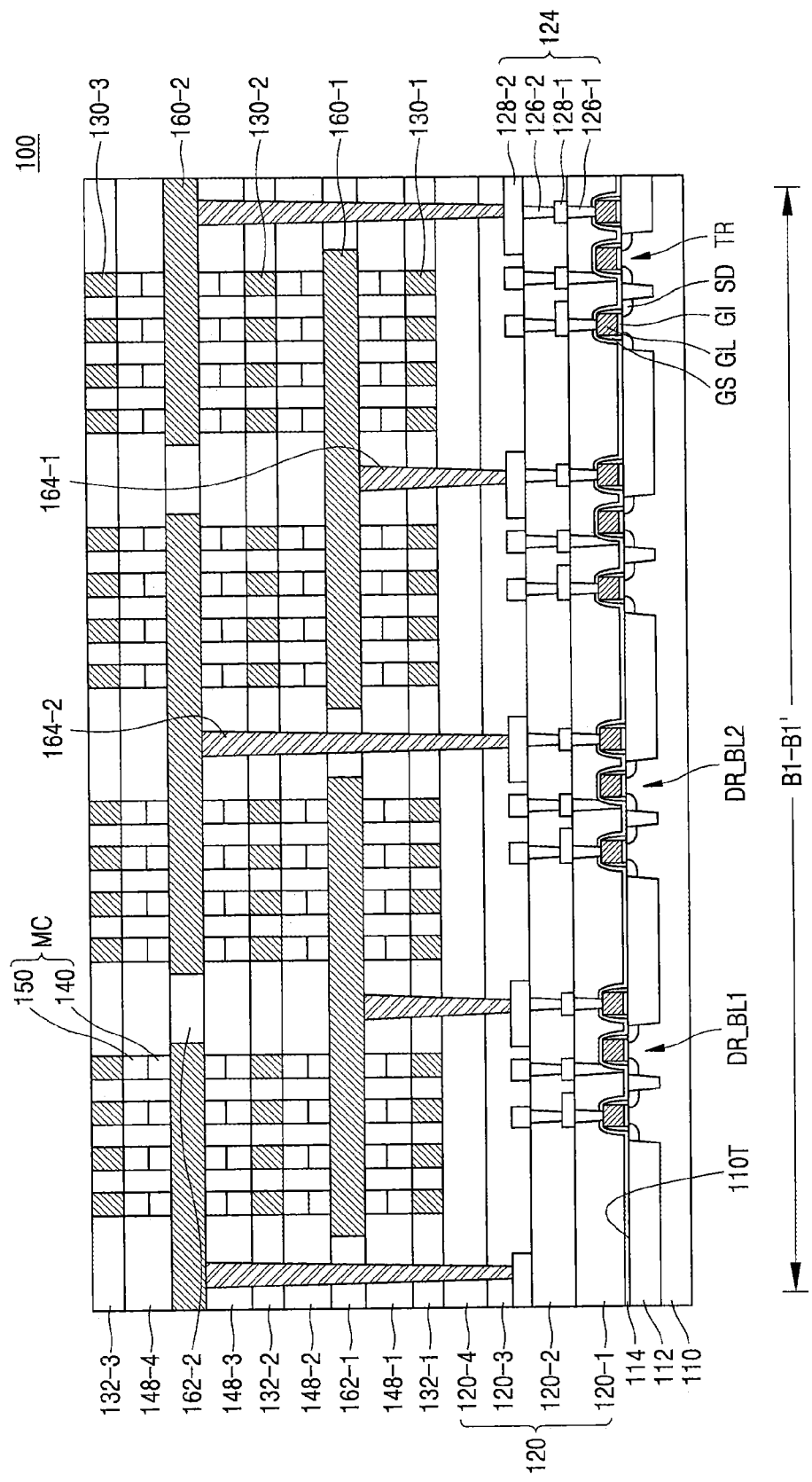
FIG. 9 is a cross-sectional view taken along line B1-B1' of FIGS. 4 to 7.

FIG. 3 is a perspective view of a memory device 100 according to example embodiments of the inventive concept. FIGS. 4 to 7 are top layout views of first cell blocks BF1, second cell blocks BF2, third cell blocks BF3, and fourth cell blocks BF4 of FIG. 3, respectively. FIG. 8 is a cross-sectional view taken along line A1-A1' of FIGS. 4 to 7. FIG. 9 is a cross-sectional view taken along line B1-B1' of FIGS. 4 to 7.

Referring to FIGS. 3 to 9, the memory device 100 may include a plurality of first word lines 130-1, a plurality of second word lines 130-2, a plurality of third word lines 130-3, a plurality of first bit lines 160-1, a plurality of second bit lines 160-2, and a plurality of memory cells MC provided on the substrate 110.

The first word lines 130-1 may extend on the substrate 110 in a first direction (e.g., the X direction of FIG. 3), and the first bit lines 160-1 may extend on the first word lines 130-1 in a second direction (e.g., the Y direction of FIG. 3). The second word lines 130-2 may extend on the first bit lines 160-1 in the first direction, the second bit lines 160-2 may extend on the second word lines 130-2 in the second direction, and the third word lines 130-3 may extend on the second bit lines 160-2 in the first direction.

The memory cells MC may be provided between the first word lines 130-1 and the first bit lines 160-1, between the first bit lines 160-1 and the second word lines 130-2, between the second word lines 130-2 and the second bit lines 160-2, and between the second bit lines 160-2 and the third word lines 130-3.

The memory device 100 may include the first to fourth cell blocks BF1, BF2, BF3, and BF4 provided on the substrate 110 at different levels in a third direction (e.g., the Z direction of FIG. 3). Each first cell block BF1 may include the first word lines 130-1 and the first bit lines 160-1, and the memory cells MC therebetween, and each second cell block BF2 may include the first bit lines 160-1 and the second word lines 130-2, and the memory cells MC therebetween. Each third cell block BF3 may include the second word lines 130-2 and the second bit lines 160-2, and the memory cells MC therebetween, and each fourth cell block BF4 may include the second bit lines 160-2 and the third word lines 130-3, and the memory cells MC therebetween.

Figure 4:
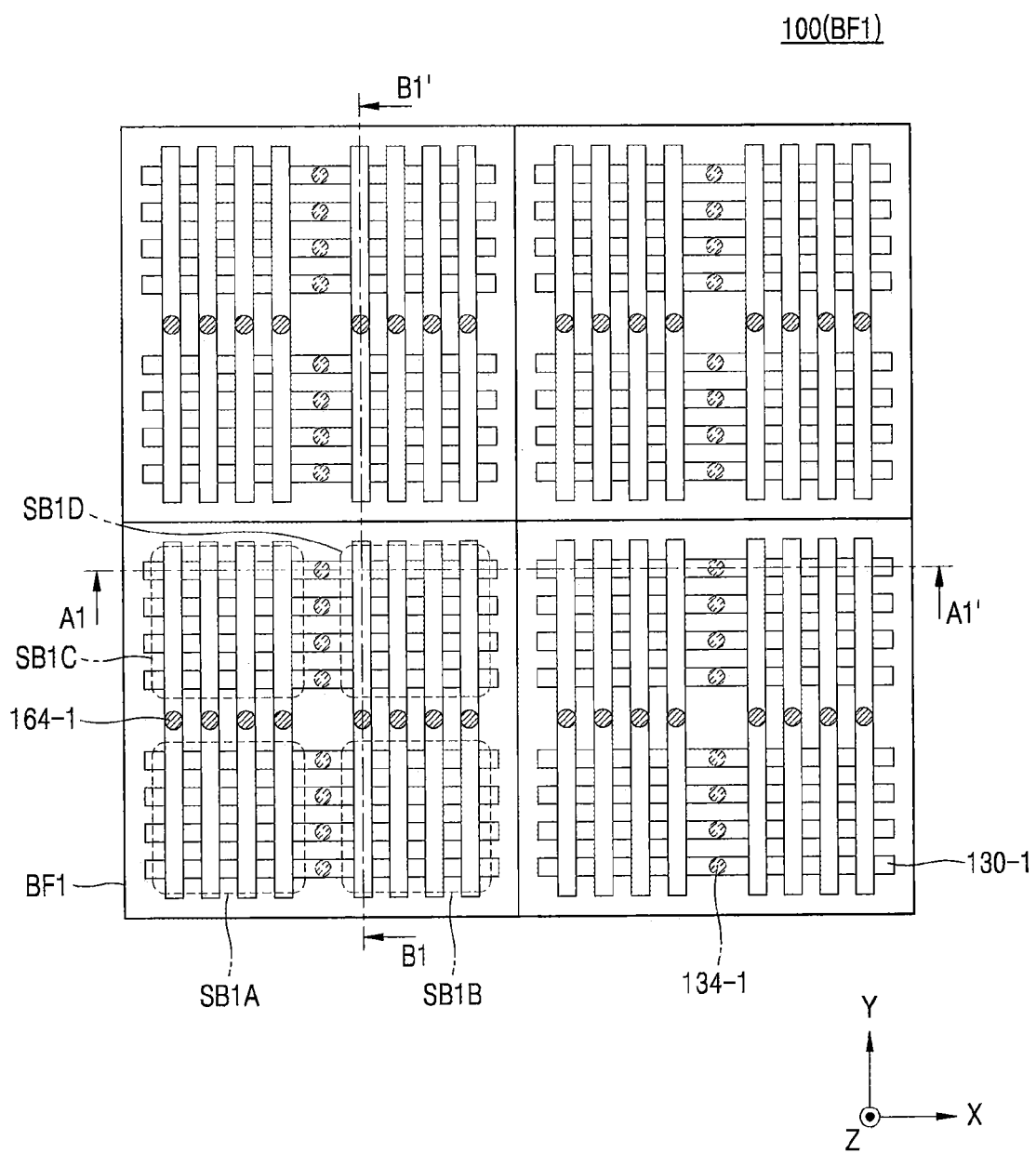
FIGS. 4 to 7 are top layout views of first cell blocks, second cell blocks, third cell blocks, and fourth cell blocks of FIG. 3, respectively.

FIG. 4 schematically shows the arrangement of the first word lines 130-1 and the first bit lines 160-1 provided in each first cell block BF1, and first word line contacts 134-1 and first bit line contacts 164-1.

The first cell block BF1 may include the first word lines 130-1 extending in the first direction (e.g., the X direction), and the first bit lines 160-1 extending in the second direction (e.g., the Y direction). The first word lines 130-1 provided in a first cell block BF1 are not connected to the first word lines 130-1 provided in another adjacent first cell block BF1. The first bit lines 160-1 provided in a first cell block BF1 are not connected to the first bit lines 160-1 provided in another adjacent first cell block BF1.

As used herein, a cell block may be defined to include a plurality of memory cells MC configured by a first word line set including a plurality of first word lines 130-1 extending in the first direction and spaced apart from each other, and a first bit line set including a plurality of first bit lines 160-1 extending in the second direction and spaced apart from each other. That is, in FIG. 4, two first cell blocks BF1 in the first direction and two first cell blocks BF1 in the second direction are arranged in a matrix.

The first cell block BF1 may include first to fourth sub cell array regions SB1A, SB1B, SB1C, and SB1D. The first and second sub cell array regions SB1A and SB1B may be spaced apart from each other in the first direction. The third and fourth sub cell array regions SB1C and SB1D may be spaced apart from each other in the first direction, and be respectively spaced apart from the first and second sub cell array regions SB1A and SB1B in the second direction. The first sub cell array region SB1A may be connected to the second sub cell array region SB1B by the first word lines 130-1, and may be connected to the third sub cell array region SB1C by the first bit lines 160-1.

For example, as illustrated in FIG. 4, the first word line contacts 134-1 separately connected to the first word lines 130-1 may be provided between the first and second sub cell array regions SB1A and SB1B. The first bit line contacts 164-1 separately connected to the first bit lines 160-1 may be provided between the first and third sub cell array regions SB1A and SB1C.

For example, as illustrated in FIG. 4 or 8, because the first word line contacts 134-1 are provided between the first and second sub cell array regions SB1A and SB1B, the first word line contacts 134-1 may overlap with center points of the first word lines 130-1 in the first direction. That is, when each first word line 130-1 has a first length L1 (refer to FIG. 8) in the first direction, a distance between each first word line contact 134-1 and an end of the first word line 130-1 may correspond to ½ of the first length L1. Therefore, a distance between the first word line contact 134-1 and a farthest memory cell MC therefrom may correspond to ½ of the first length L1.

Because the first word line contacts 134-1 are provided between the first and second sub cell array regions SB1A and SB1B, a distance between the first word line contacts 134-1 and the memory cells MC may be reduced and the first cell block BF1 may have a lower wiring resistance. In addition, voltage drop (or IR drop) due to a resistance of wiring lines (e.g., a resistance of the first word lines 130-1) may be reduced and, thus, a difference or deviation in electrical characteristics of the memory cells MC provided in the first cell block BF1 based on locations thereof may also be reduced.

Figure 5:
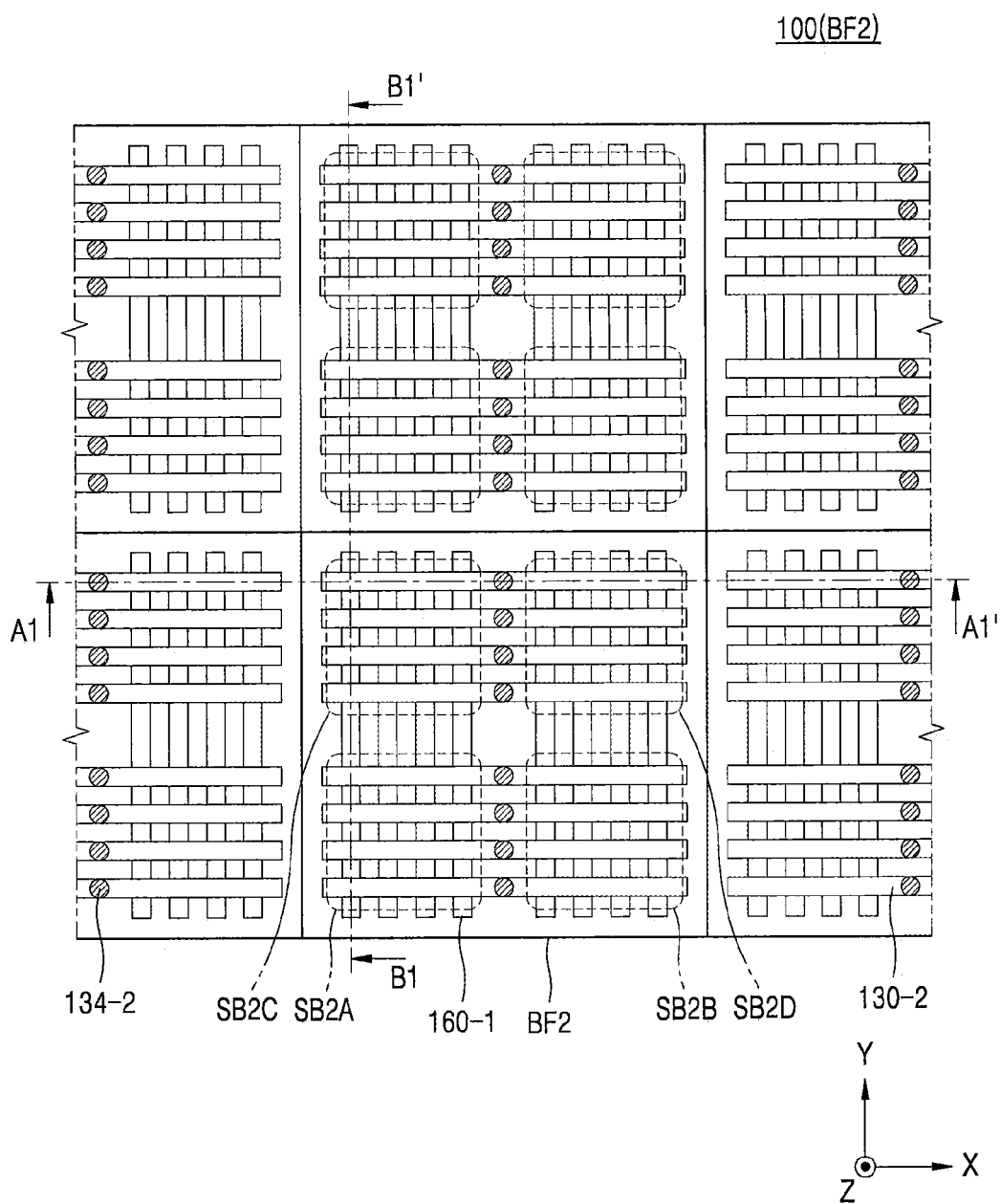

For example, as illustrated in FIG. 5, each second cell block BF2 may include first to fourth sub cell array regions SB2A, SB2B, SB2C, and SB2D. In a plan view, the second cell block BF2 may be shifted or offset from the first cell block BF1 by ½ of the first width W1 (see FIG. 2A) of the first cell block BF1 in the first direction. That is, the second word lines 130-2, provided in the second cell block BF2, may be shifted or offset from the first word lines 130-1, provided in the first cell block BF1, by ½ of the first width W1 in the first direction. Second word line contacts 134-2, provided in the second cell block BF2 and connected to the second word lines 130-2, may be spaced apart from the first word line contacts 134-1, provided in the first cell block BF1, by ½ of the first width W1 in the first direction. Alternatively, when each first word line 130-1 has the first length L1 in the first direction, the second word lines 130-2 may be shifted or offset from the first word lines 130-1 by ½ of the first length L1 in the first direction, and the second word line contacts 134-2 may be spaced apart from the first word line contacts 134-1 by ½ of the first length L1 in the first direction. That is, in a plan view, the second word line contacts 134-2 may not overlap with the first word line contacts 134-1.

Figure 6:
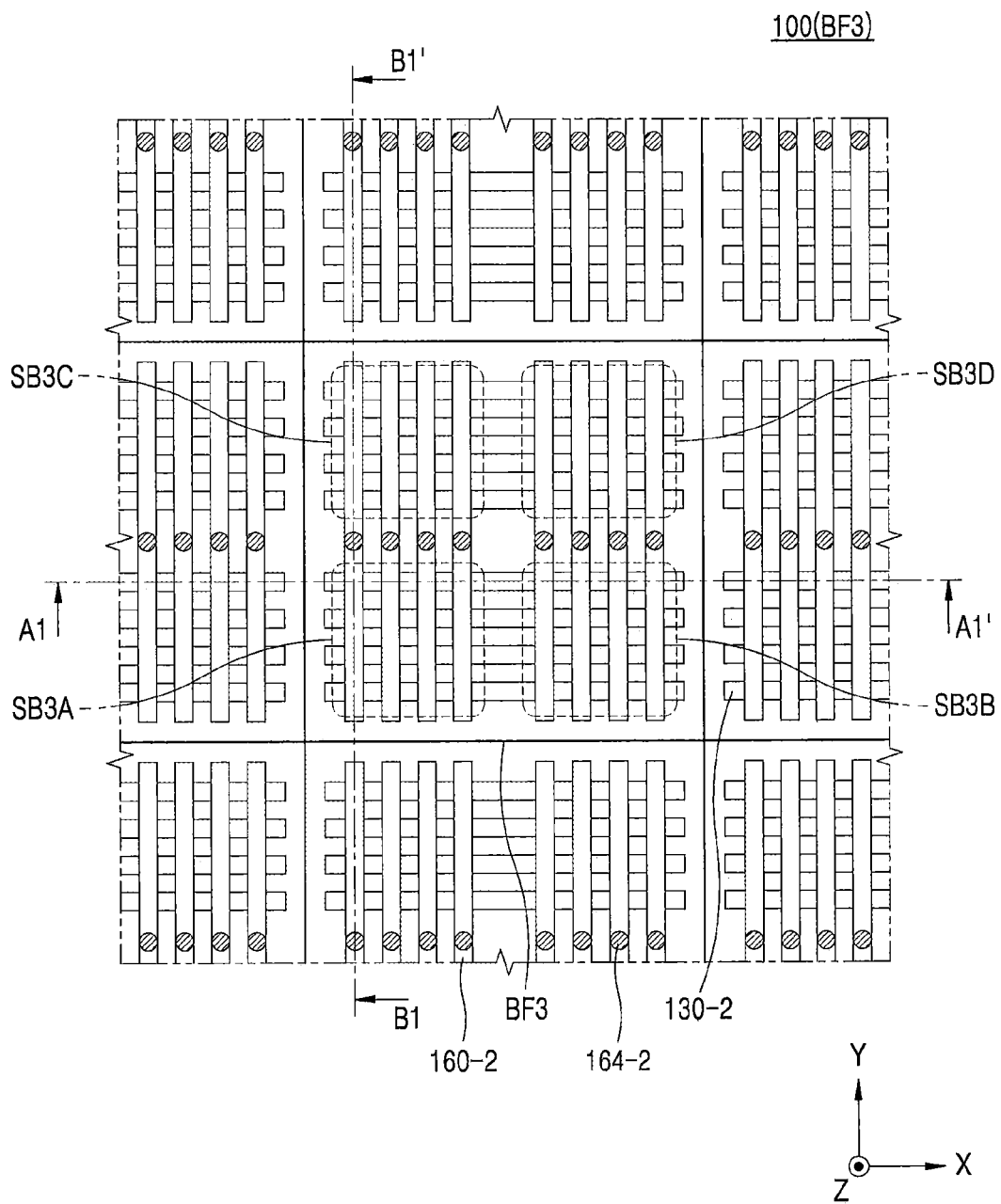
Figure 7:
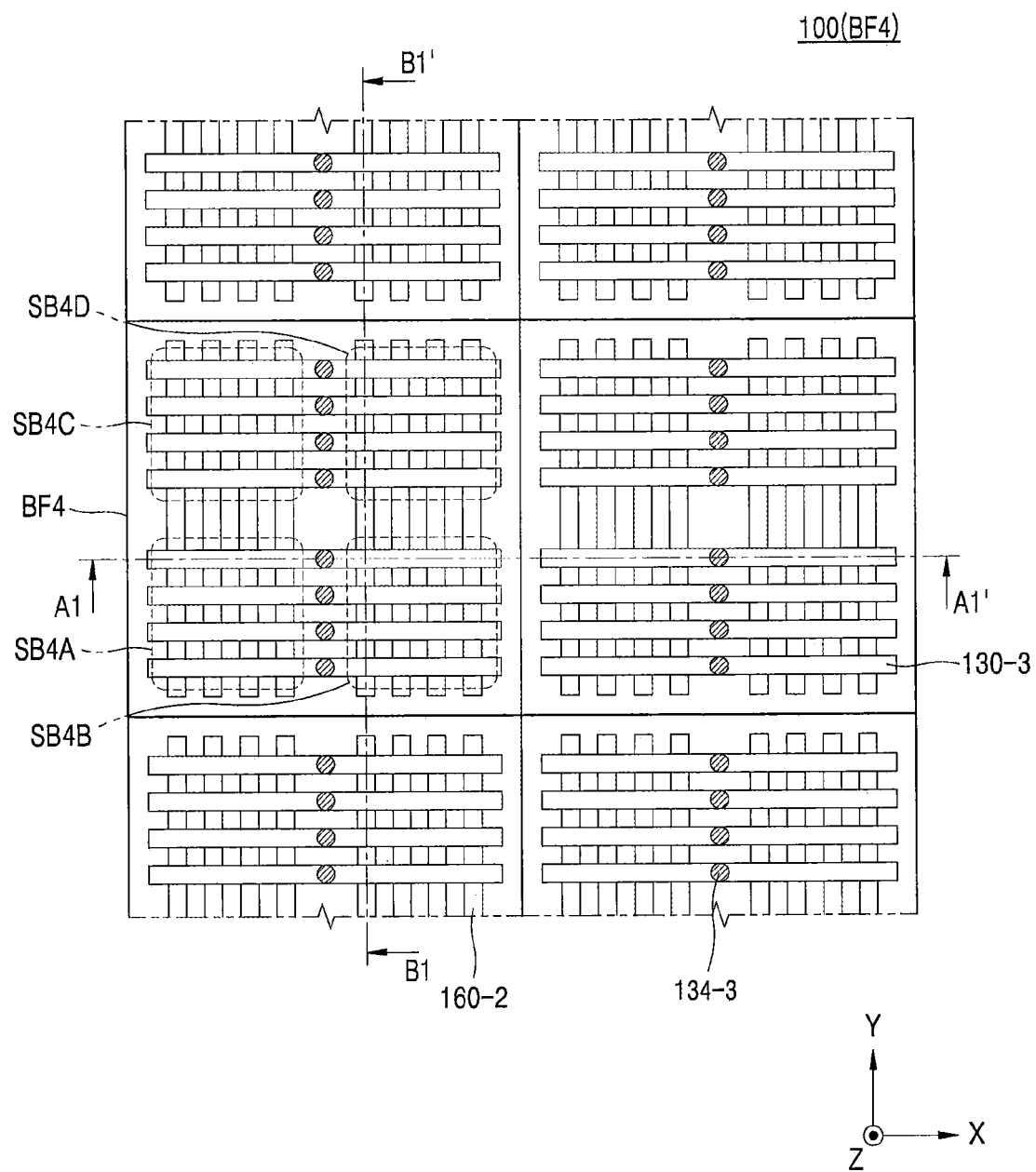

For example, as illustrated in FIGS. 6 and 7, each third cell block BF3 may include first to fourth sub cell array regions SB3A, SB3B, SB3C, and SB3D. In a plan view, the third cell block BF3 may be shifted or offset from the first cell block BF1 by ½ of the first width W1 of the first cell block BF1 in the first direction, and by ½ of the second width W2 of the first cell block BF1 in the second direction. Each fourth cell block BF4 may include first to fourth sub cell array regions SB4A, SB4B, SB4C, and SB4D. In a plan view, the fourth cell block BF4 may be shifted or offset from the first cell block BF1 by ½ of the second width W2 of the first cell block BF1 in the second direction.

The second bit lines 160-2, provided in the fourth cell block BF4, may be shifted or offset from the first bit lines 160-1, provided in the first cell block BF1, by ½ of the second width W2 in the second direction. Second bit line contacts 164-2, provided in the fourth cell block BF4 and connected to the second bit lines 160-2, may be spaced apart from the first bit line contacts 164-1, provided in the first cell block BF1, by ½ of the second width W2 in the second direction.

In example embodiments, the third sub cell array region SB2C of the second cell block BF2, the first sub cell array region SB3A of the third cell block BF3, and the second sub cell array region SB4B of the fourth cell block BF4 may be sequentially provided on the fourth sub cell array region SB1D of the first cell block BF1 in the third direction.

For example, as illustrated in FIGS. 4, 7, and 8, the third word lines 130-3 provided in the fourth cell block BF4 may vertically overlap with the first word lines 130-1 provided in the first cell block BF1. Third word line contacts 134-3 separately connected to the third word lines 130-3 may overlap with the first word line contacts 134-1 separately connected to the first word lines 130-1. The third word lines 130-3 may be separately and electrically connected to the first word lines 130-1 by the third word line contacts 134-3. As such, the third word lines 130-3 may be electrically connected to the first word line driving region DR_WL1 for driving the first word lines 130-1 through the third word line contacts 134-3 and the first word line contacts 134-1.

For example, as illustrated in FIG. 8, the first word line driving region DR_WL1 may vertically overlap with the first word line contacts 134-1 of the first cell block BF1 and the third word line contacts 134-3 of the fourth cell block BF4, but embodiments of the inventive concept are not limited thereto. The second word line driving region DR_WL2 may vertically overlap with the second word line contacts 134-2 of the second and third cell blocks BL2 and BL3. The first bit line driving region DR_BL1 may vertically overlap with the first bit line contacts 164-1 of the first and second cell blocks BF1 and BF2, and the second bit line driving region DR_BL2 may vertically overlap with the second bit line contacts 164-2 of the third and fourth cell blocks BF3 and BF4.

As illustrated in FIGS. 8 and 9, a plurality of transistors TR for configuring driving circuits may be provided on the substrate 110. An active region (not shown) for the driving circuits may be defined on the substrate 110 by an isolation layer 112, and the transistors TR may be provided on the active region. Each of the transistors TR may include a gate GL, a gate insulating layer GI, and source/drain regions SD. Both side walls of the gate GL may be covered with a gate spacer GS, and an etch stop layer 114 may be provided on a top surface 110T of the substrate 110 to cover the gate GL and the gate spacer GS. The etch stop layer 114 may include an insulating material, such as silicon nitride or silicon oxynitride.

An interlayer insulating layer 120 may be provided on the etch stop layer 114, the interlayer insulating layer 120 including a first lower insulating layer 120-1, a second lower insulating layer 120-2, a third lower insulating layer 120-3, and a fourth lower insulating layer 120-4. A multilayer wiring structure 124 may be electrically connected to each of the transistors TR. The multilayer wiring structure 124 may include a first via 126-1, a first wiring layer 128-1, a second via 126-2, and a second wiring layer 128-2, which are sequentially stacked on one another and electrically connected to each other on the substrate 110, and may be surrounded by the interlayer insulating layer 120. The interlayer insulating layer 120 may be made of an oxide, such as silicon oxide, or a nitride, such as silicon nitride.

Each of the first word lines 130-1, the first bit lines 160-1, the second word lines 130-2, the second bit lines 160-2, and the third word lines 130-3 may be made of a metal, a conductive metal nitride, a conductive metal oxide, or a combination thereof. For example, each of the first word lines 130-1, the first bit lines 160-1, the second word lines 130-2, the second bit lines 160-2, and the third word lines 130-3 may be made of tungsten (W), tungsten nitride (WN), gold (Au), silver (Ag), copper (Cu), aluminum (Al), titanium aluminum nitride (TiAlN), iridium (Ir), platinum (Pt), palladium (Pd), ruthenium (Ru), zirconium (Zr), rhodium (Rh), nickel (Ni), cobalt (Co), chromium (Cr), tin (Sn), zinc (Zn), indium tin oxide (ITO), an alloy thereof, or a combination thereof, or include a metal layer and a conductive barrier layer covering at least a part of the metal layer. The conductive barrier layer may be made of, for example, titanium (Ti), titanium nitride (TiN), tantalum (Ta), tantalum nitride (TaN), or a combination thereof.

The memory cells MC may be provided between the first word lines 130-1, the first bit lines 160-1, the second word lines 130-2, the second bit lines 160-2, and the third word lines 130-3. Each memory cell MC may include a switching unit 140 and a memory unit 150 provided on the switching unit 140. In example embodiments, the memory cells MC may have a rectangular pillar shape. In other embodiments, the memory cells MC may have various pillar shapes, such as, but not limited to, circular, oval, or polygonal pillar shapes.

A first insulating layer 132-1 may be provided on the interlayer insulating layer 120 between the first word lines 130-1, and a second insulating layer 148-1 may be provided on the first insulating layer 132-1 and the first word lines 130-1 to fill spaces between adjacent ones of the memory cells MC. A third insulating layer 162-1 may be provided on the second insulating layer 148-1 between adjacent ones of the first bit lines 160-1, and a fourth insulating layer 148-2 may be provided on the third insulating layer 162-1 and the first bit lines 160-1 to fill spaces between adjacent ones of the memory cells MC. A fifth insulating layer 132-2 may be provided on the fourth insulating layer 148-2 between adjacent ones of the second word lines 130-2, and a sixth insulating layer 148-3 may be provided on the fifth insulating layer 132-2 and the second word lines 130-2 to fill spaces between adjacent ones of the memory cells MC. A seventh insulating layer 162-2 may be provided on the sixth insulating layer 148-3 between adjacent ones of the second bit lines 160-2, and an eighth insulating layer 148-4 may be provided on the seventh insulating layer 162-2 and the second bit lines 160-2 to fill spaces between adjacent ones of the memory cells MC. A ninth insulating layer 132-3 may be provided on the eighth insulating layer 148-4 between adjacent ones of the third word lines 130-3. Meanwhile, the first to ninth insulating layers 132-1, 148-1, 162-1, 148-2, 132-2, 148-3, 162-2, 148-4, and 132-3 may be made of the same material, or, in other embodiments, at least one thereof may be made of a different material from the others. For example, the first to ninth insulating layers 132-1, 148-1, 162-1, 148-2, 132-2, 148-3, 162-2, 148-4, and 132-3 may include one or more of silicon oxide, silicon nitride, or silicon oxynitride. Air spaces (not shown) may be provided instead of at least one of the first to ninth insulating layers 132-1, 148-1, 162-1, 148-2, 132-2, 148-3, 162-2, 148-4, and 132-3 and, in this embodiment, an insulating liner (not shown) having a certain thickness may be provided between the air spaces and the memory cells MC.

For example, as illustrated in FIGS. 8 and 9, the first word line contacts 134-1 may pass through the interlayer insulating layer 120 and be electrically connected to the first word line driving region DR_WL1 provided on the substrate 110. The second word line contacts 134-2 may pass through the interlayer insulating layer 120 and the first to fourth insulating layers 132-1, 148-1, 162-1, and 148-2 and be electrically connected to the second word line driving region DR_WL2. The first bit line contacts 164-1 may pass through the interlayer insulating layer 120 and the first and second insulating layers 132-1 and 148-1 and be electrically connected to the first bit line driving region DR_BL1, and the second bit line contacts 164-2 may pass through the interlayer insulating layer 120 and the first to sixth insulating layers 132-1, 148-1, 162-1, 148-2, 132-2, and 148-3 and be electrically connected to the second bit line driving region DR_BL2. The third word line contacts 134-3 may be electrically connected to the first word line driving region DR_WL1 through the first word line contacts 134-1.

In general, when cell blocks are vertically stacked in multiple layers, a wiring connection structure including bit line contacts and word line contacts used to provide electrical connection to the cell blocks may be provided outside the cell blocks. Particularly, when cell blocks are vertically stacked in multiple layers, because a wiring connection structure for cell blocks of each layer is provided outside the cell blocks, an area of a wiring connection region for providing the wiring connection structure may be increased and, thus, a total chip area of a memory device may also be increased.

However, according to the afore-described example embodiments, the first through third word line contacts 134-1, 134-2, and 134-3 and the first and second bit line contacts 164-1 and 164-2 may be provided at locations overlapping with the first to fourth cell blocks BF1, BF2, BF3, and BF4. Therefore, a wiring connection structure having a reduced or minimum length from the first to fourth cell blocks BF1, BF2, BF3, and BF4 to the driving circuit region DR (see FIG. 2A) may be obtained by the first through third word line contacts 134-1, 134-2, and 134-3 and the first and second bit line contacts 164-1 and 164-2. Thus, the memory device 100 may have a relatively compact size.

In addition, according to the afore-described example embodiments, because the first word line contacts 134-1 are provided between the first and second sub cell array regions SB1A and SB1B, a distance between the first word line contacts 134-1 and the memory cells MC may be reduced, and, thus, voltage drop (or IR drop) due to a resistance of wiring lines may also be reduced. Consequently, a difference or deviation in electrical characteristics of the memory cells MC provided in the first to fourth cell blocks BF1, BF2, BF3, and BF4 based on locations thereof may be reduced.

Detailed configurations of memory cells MC, MC-1, MC-2, MC-3, and MC-4 according to example embodiments of the inventive concept will now be described with reference to FIGS. 10 to 14.

Figure 10:
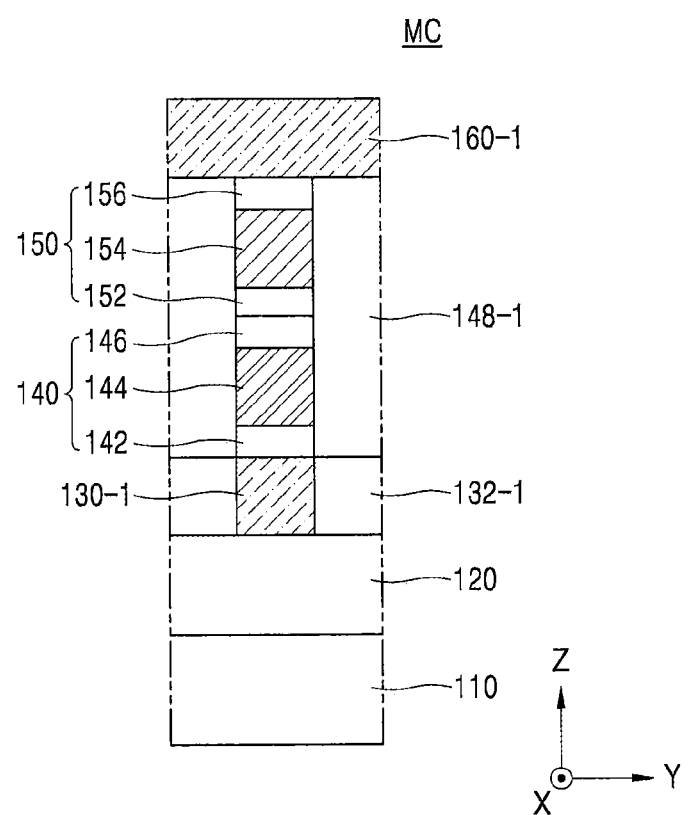
FIGS. 10 to 14 are cross-sectional views of memory cells according to example embodiments of the inventive concept.

Referring to FIG. 10, the memory cell MC may include the switching unit 140 and the memory unit 150 provided on the switching unit 140. The switching unit 140 may include a first electrode layer 142, a switching material layer 144, and a second electrode layer 146 sequentially stacked on each of a plurality of first word lines 130-1.

The switching material layer 144 may be a current control layer configured to control the flow of a current. The switching material layer 144 may include a material layer, a resistance of which is variable based on the magnitude of a voltage applied to both ends of the switching material layer 144 and/or a current passing therethrough. For example, the switching material layer 144 may include a material layer having Ovonic threshold switching (OTS) characteristics. Example functionality of the switching material layer 144 based on the OTS material layer will now be briefly described. When a voltage lower than a threshold voltage is applied to the switching material layer 144, the switching material layer 144 is maintained in a high-resistance state and, thus, little current flows therethrough. When a voltage higher than the threshold voltage is applied to the switching material layer 144, the switching material layer 144 is in a low-resistance state and, thus, a current starts to flow therethrough. When the current flowing through the switching material layer 144 is lower than a holding current, the switching material layer 144 may transition to a high-resistance state.

The switching material layer 144 may include a chalcogenide material as the OTS material layer. In example embodiments, the switching material layer 144 may include silicon (Si), tellurium (Te), arsenic (As), germanium (Ge), indium (In), or a combination thereof. For example, the switching material layer 144 may include silicon (Si) at a content of about 14%, tellurium (Te) at a content of about 39%, arsenic (As) at a content of about 37%, germanium (Ge) at a content of about 9%, and indium (In) at a content of about 1%. Herein, the percentages are atomic percentages out of a total of 100%, and this principle may be equally applied to the following description. In other embodiments, the switching material layer 144 may include silicon (Si), tellurium (Te), arsenic (As), germanium (Ge), sulfur (S), selenium (Se), or a combination thereof. For example, the switching material layer 144 may include silicon (Si) at a content of about 5%, tellurium (Te) at a content of about 34%, arsenic (As) at a content of about 28%, germanium (Ge) at a content of about 11%, sulfur (S) at a content of about 21%, and selenium (Se) at a content of about 1%. In other embodiments, the switching material layer 144 may include silicon (Si), tellurium (Te), arsenic (As), germanium (Ge), sulfur (S), selenium (Se), antimony (Sb), or a combination thereof. For example, the switching material layer 144 may include tellurium (Te) at a content of about 21%, arsenic (As) at a content of about 10%, germanium (Ge) at a content of about 15%, sulfur (S) at a content of about 2%, selenium (Se) at a content of about 50%, and antimony (Sb) at a content of about 2%.

The switching material layer 144 is not limited to the OTS material layer, and may include various material layers operable to select a device. For example, the switching material layer 144 may include, but is not limited to, a diode, a tunnel junction, a PNP diode or a bipolar junction transistor (BJT), a mixed ionic-electronic conduction (MIEC) material, or the like.

The first and second electrode layers 142 and 146 may serve as a current path and be made of a conductive material. For example, each of the first and second electrode layers 142 and 146 may be made of a metal, a conductive metal nitride, a conductive metal oxide, or a combination thereof. Each of the first and second electrode layers 142 and 146 may include a titanium nitride (TiN) layer, but embodiments of the inventive concept are not limited thereto.

The memory unit 150 may include a third electrode layer 152, a variable resistance layer 154, and a fourth electrode layer 156 sequentially stacked on the switching unit 140.

In example embodiments, the variable resistance layer 154 may include a phase change material, which is reversibly changed between an amorphous state and a crystalline state based on a heating time. For example, the variable resistance layer 154 may have a phase which is reversibly changeable by Joule heat generated due to a voltage applied to both ends of the variable resistance layer 154, and may include a material, a resistance of which is variable due to the phase change. Specifically, the phase change material may transition to a high-resistance state in an amorphous phase, and transition to a low-resistance state in a crystalline phase. By defining the high-resistance state as "0" and defining the low-resistance state as "1," data may be stored in the variable resistance layer 154.

In some embodiments, the variable resistance layer 154 may include one or more elements (chalcogen elements) from group VI in the periodic table, and may include one or more chemical modifiers from group III, IV, or V in the periodic table. For example, the variable resistance layer 154 may include Ge—Sb—Te. Herein, the chemical composition using hyphens may indicate elements included in a certain mixture or compound, and represent all chemical structures including the indicated elements. For example, Ge—Sb—Te may be a material compound, such as $Ge_2Sb_2Te_5$, $Ge_2Sb_2Te_7$, $Ge_1Sb_2Te_4$, or $Ge_1Sb_4Te_7$.

In addition to Ge—Sb—Te, the variable resistance layer 154 may include various phase change materials. For example, the variable resistance layer 154 may include at least one or a combination of Ge—Te, Sb—Te, In—Se, Ga—Sb, In—Sb, As—Te, Al—Te, Bi—Sb—Te (BST), In—Sb—Te (IST), Ge—Sb—Te, Te—Ge—As, Te—Sn—Se, Ge—Se—Ga, Bi—Se—Sb, Ga—Se—Te, Sn—Sb—Te, In—Sb—Ge, In—Ge—Te, Ge—Sn—Te, Ge—Bi—Te, Ge—Te—Se, As—Sb—Te, Sn—Sb—Bi, Ge—Te—O, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—Pt, In—Sn—Sb—Te, and As—Ge—Sb—Te.

Each element of the variable resistance layer 154 may have various stoichiometric ratios. Crystallization temperature, melting temperature, phase change speed based on crystallization energy, and data retention characteristics of the variable resistance layer 154 may be controlled based on the stoichiometric ratio of each element.

The variable resistance layer 154 may further include at least one impurity among carbon (C), nitrogen (N), silicon (Si), oxygen (O), bismuth (Bi), and tin (Sn). A driving current of the memory device 100 may be changed by the impurity. The variable resistance layer 154 may further include a metal. For example, the variable resistance layer 154 may include at least one of aluminum (Al), gallium (Ga), zinc (Zn), titanium (Ti), chromium (Cr), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), zirconium (Zr), thallium (Tl), lead (Pb), and polonium (Po). The above-mentioned metallic materials may increase electrical conductivity and thermal conductivity of the variable resistance layer 154, thereby increasing crystallization speed and set speed. In addition, the metallic materials may improve data retention characteristics of the variable resistance layer 154.

The variable resistance layer 154 may have a multilayer structure in which two or more layers having different properties are stacked on one another. The number or thickness of the layers may be freely selected. A barrier layer configured to reduce or prevent diffusion of a material between the layers may be further provided between the layers. In addition, the variable resistance layer 154 may have a super-lattice structure in which a plurality of layers including different materials are alternately stacked on one another. For example, the variable resistance layer 154 may have a structure in which first layers made of Ge—Te and second layers made of Sb—Te are alternately stacked on one another. However, the first and second layers are not limited to Ge—Te and Sb—Te, and may include the above-mentioned various materials.

Although the variable resistance layer 154 includes a phase change material in the embodiments described above, embodiments of the inventive concept are not limited thereto and the variable resistance layer 154 may include various materials having variable resistance characteristics in other embodiments.

In some embodiments, when the variable resistance layer 154 includes a transition metal oxide, the memory device 100 may be resistive RAM (ReRAM). Using the variable resistance layer 154 including a transition metal oxide, at least one electrical path may be generated in or eliminated from the variable resistance layer 154 due to a program operation. The variable resistance layer 154 may have a low resistance value when the electrical path is generated, and have a high resistance value when the electrical path is eliminated. The memory device 100 may store data by using the difference in the resistance value of the variable resistance layer 154.

When the variable resistance layer 154 is made of a transition metal oxide, the transition metal oxide may include at least one metal selected among tantalum (Ta), zirconium (Zr), titanium (Ti), hafnium (Hf), manganese (Mn), yttrium (Y), nickel (Ni), cobalt (Co), zinc (Zn), niobium (Nb), copper (Cu), iron (Fe), and chromium (Cr). For example, the transition metal oxide may include a monolayer or a multilayer made of at least one material selected among $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, and $Fe_2O_{3-x}$. In the above-mentioned materials, x and y may be selected in ranges of $0 \leq x \leq 1.5$ and $0 \leq y \leq 0.5$, but embodiments of the inventive concept are not limited thereto.

In other embodiments, when the variable resistance layer 154 has a magnetic tunnel junction (MTJ) structure including two electrodes made of a magnetic material, and a dielectric provided between the two magnetic electrodes, the memory device 100 may be magnetic RAM (MRAM).

The two electrodes may be a pinned layer (or a fixed layer) and a free layer, and the dielectric provided between the two electrodes may be a tunnel barrier layer. The pinned layer may have a magnetization direction, which is pinned to a direction, and the free layer may have a magnetization direction, which is changeable to be parallel or antiparallel to the magnetization direction of the pinned layer. The magnetization directions of the pinned layer and the free layer may be parallel to a surface of the tunnel barrier layer, but embodiments of the inventive concept are not limited thereto. The magnetization directions of the pinned layer and the free layer may be perpendicular to a surface of the tunnel barrier layer.

When the magnetization direction of the free layer is parallel to the magnetization direction of the pinned layer, the variable resistance layer 154 may have a first resistance value. When the magnetization direction of the free layer is antiparallel to the magnetization direction of the pinned layer, the variable resistance layer 154 may have a second resistance value. The memory device 100 may store data by using the difference in the resistance value. The magnetization direction of the free layer may be changed due to spin torque of electrons in a program current.

The pinned layer and the free layer may include a magnetic material. In these embodiments, the pinned layer may further include an antiferromagnetic material for pinning a magnetization direction of the ferromagnetic material in the pinned layer. The tunnel barrier layer may be made of an oxide of any one material selected among Mg, Ti, Al, MgZn, and MgB, but embodiments of the inventive concept are not limited to the above-mentioned materials.

The third and fourth electrode layers 152 and 156 may serve as a current path and may be made of a conductive material. For example, each of the third and fourth electrode layers 152 and 156 may be made of a metal, a conductive metal nitride, a conductive metal oxide, or a combination thereof. In example embodiments, at least one of the third and fourth electrode layers 152 and 156 may include a conductive material configured to generate sufficient heat to change the phase of the variable resistance layer 154. For example, the third and fourth electrode layers 152 and 156 may be made of a high-melting-point metal, such as TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or a combination thereof, a nitride thereof, or a carbon-based conductive material. However, embodiments of the third and fourth electrode layers 152 and 156 are not limited to the above-mentioned materials. In other embodiments, each of the third and fourth electrode layers 152 and 156 may include a conductive layer made of a metal, a conductive metal nitride, or a conductive metal oxide, and at least one conductive barrier layer covering at least a part of the conductive layer. The conductive barrier layer may be made of a metal oxide, a metal nitride, or a combination thereof, but embodiments of the inventive concept are not limited thereto.

In other embodiments, at least one of the first to fourth electrode layers 142, 146, 152, and 156 may be omitted. One of the second and third electrode layers 146 and 152 may not be omitted to reduce or prevent contamination or contact failure due to direct contact between the switching material layer 144 and the variable resistance layer 154. In addition, any one of the second and third electrode layers 146 and 152 may have a larger thickness than the other. As such, when the third or fourth electrode layer 152 or 156 is heated to change the phase of the variable resistance layer 154, influence of the heat on the switching material layer 144 adjacent thereto may be reduced or prevented (for example, deterioration or damage, e.g., partial crystallization, of the switching material layer 144 due to the heat provided from the third or fourth electrode layer 152 or 156 may be reduced or prevented).

Figure 11:
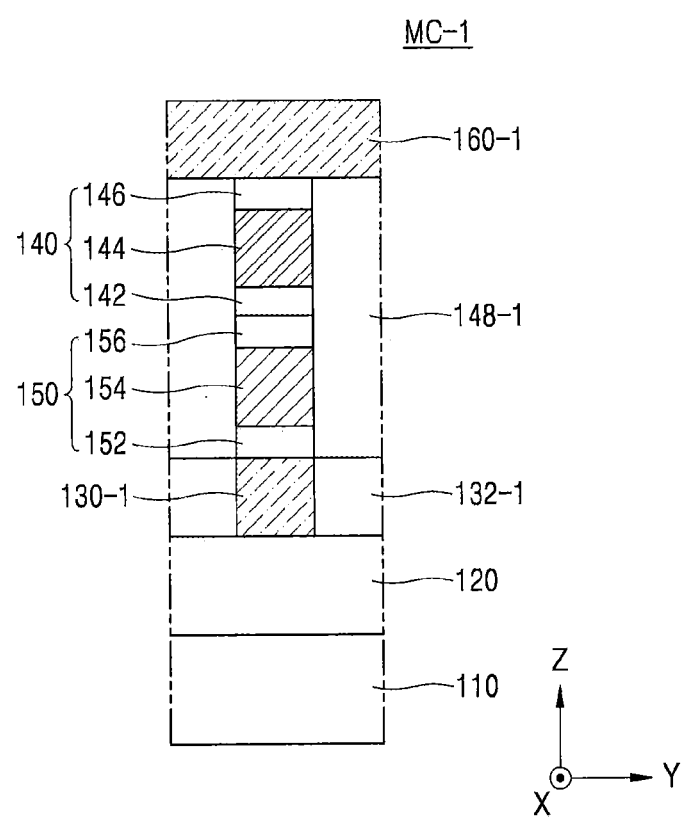

Referring to FIG. 11, the memory cell MC-1 may include the memory unit 150 provided on the first word lines 130-1, and the switching unit 140 provided on the memory unit 150.

According to example embodiments, the memory cell MC-1 may be used in the memory device 100 together with the memory cell MC described above with respect to FIG. 10. For example, to achieve approximately equal directions of currents flowing through the memory cells MC and MC-1, the memory cell MC-1 may be provided between the first word lines 130-1 and the first bit lines 160-1, and the memory cell MC may be provided between the first bit lines 160-1 and the second word lines 130-2.

Figure 12:
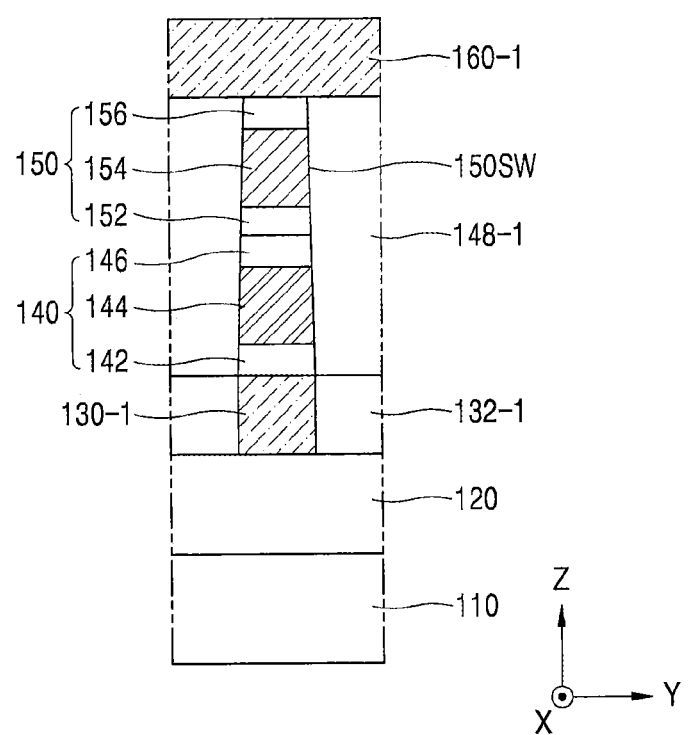

Referring to FIG. 12, the memory cell MC-2 may have sloping side walls 150SW, and a width of a top surface of the variable resistance layer 154 in a second direction (e.g., the Y direction) may be less than a width of a top surface of the switching material layer 144 in the second direction.

In example embodiments, the memory cell MC-2 may be produced by forming a memory stack (not shown) on the first word lines 130-1 and the first insulating layer 132-1, forming a mask pattern (not shown) on the memory stack, and then performing an anisotropic etching process on the memory stack by using the mask pattern as an etching mask. An upper part of the memory cell MC-2 may be exposed to an etching atmosphere for a longer time in the anisotropic etching process, and, thus, the memory cell MC-2 may have the sloping side walls 150SW.

Figure 13:
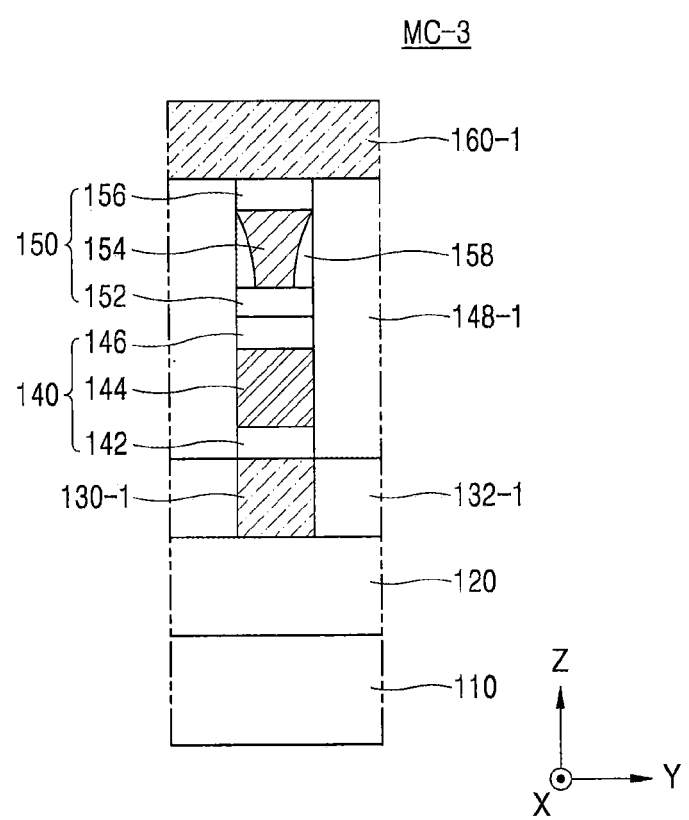

Referring to FIG. 13, the memory cell MC-3 may further include a spacer 158 provided on both side walls of the variable resistance layer 154.

In example embodiments, an insulating layer (not shown) may be formed on the third electrode layer 152, a trench may be formed in the insulating layer, and then the spacer 158 may be formed on side walls of the trench. Thereafter, the variable resistance layer 154 may be formed on the spacer 158 to fill the trench. A width of a lower part of the spacer 158 may be greater than that of an upper part thereof. The above-described process may also be referred to as a damascene process.

Figure 14:
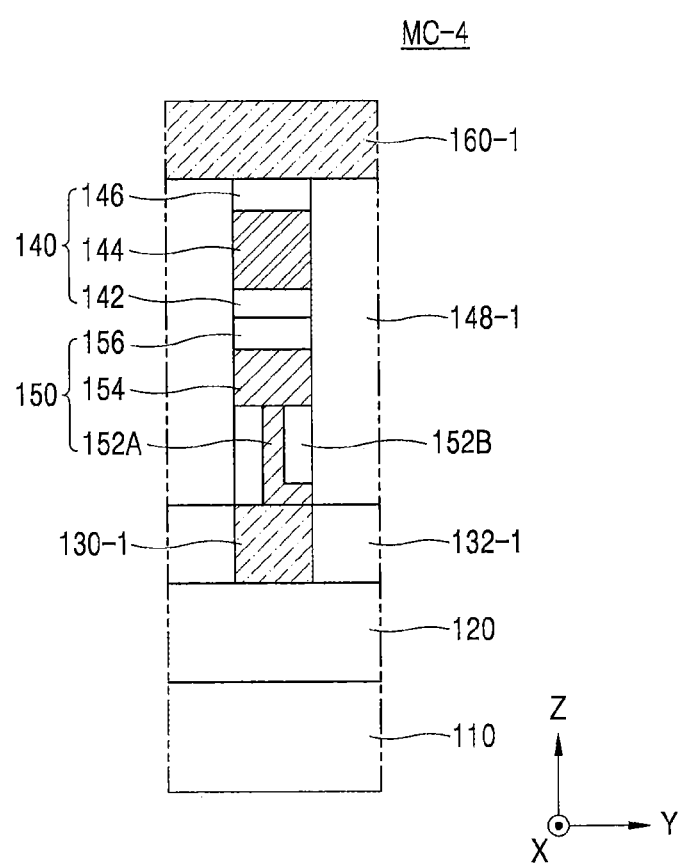

Referring to FIG. 14, the memory cell MC-4 may include a third electrode layer 152A having an 'L' shape, and a spacer 152B may be provided on both side walls of the third electrode layer 152A.

The third electrode layer 152A may include a conductive material configured to generate sufficient heat to change the phase of the variable resistance layer 154. Herein, the third electrode layer 152A may be referred to as a heating electrode. Reliability of the memory unit 150 may be increased due to a small contact area between the third electrode layer 152A and the variable resistance layer 154.

Figure 15:
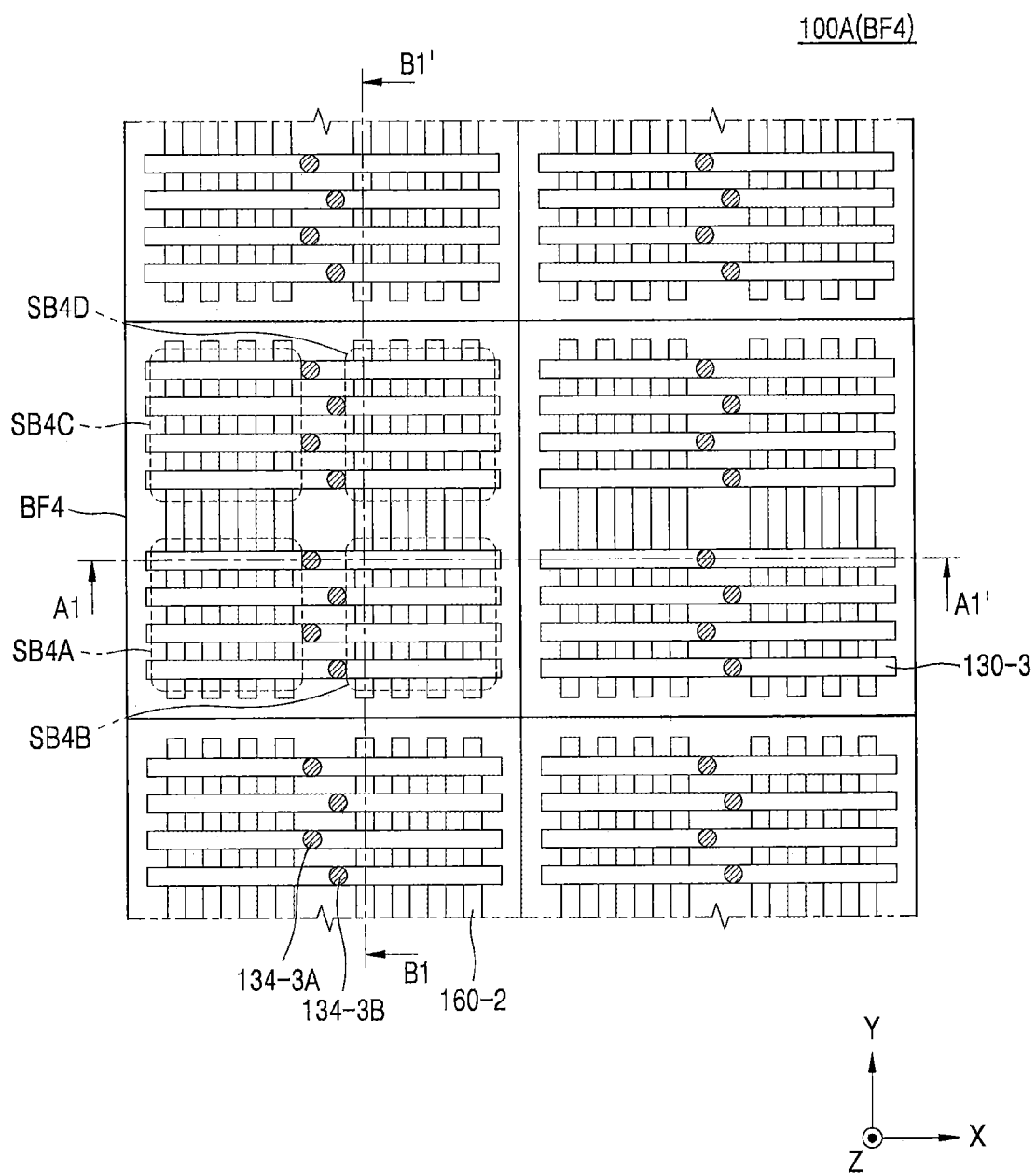
FIG. 15 is a top layout view of a memory device according to example embodiments of the inventive concept.

FIG. 15 is a top layout view of a memory device 100A according to example embodiments of the inventive concept. FIG. 15 shows the layout of the fourth cell blocks BF4 of FIG. 3. In FIGS. 1 to 15, like reference numerals denote like elements.

Referring to FIG. 15, third word line contacts 134-3A and 134-3B may be arranged in a zigzag form. That is, the third word line contacts 134-3A connected to odd-numbered third word lines 130-3 may be spaced apart from the third word line contacts 134-3B connected to even-numbered third word lines 130-3, by a certain distance in a first direction (e.g., the X direction).

Although not shown in FIG. 15, all of the first word line contacts 134-1, the second word line contacts 134-2, the first bit line contacts 164-1, and the second bit line contacts 164-2 may be arranged in a zigzag form, similar to the third word line contacts 134-3A and 134-3B.

Figure 16:
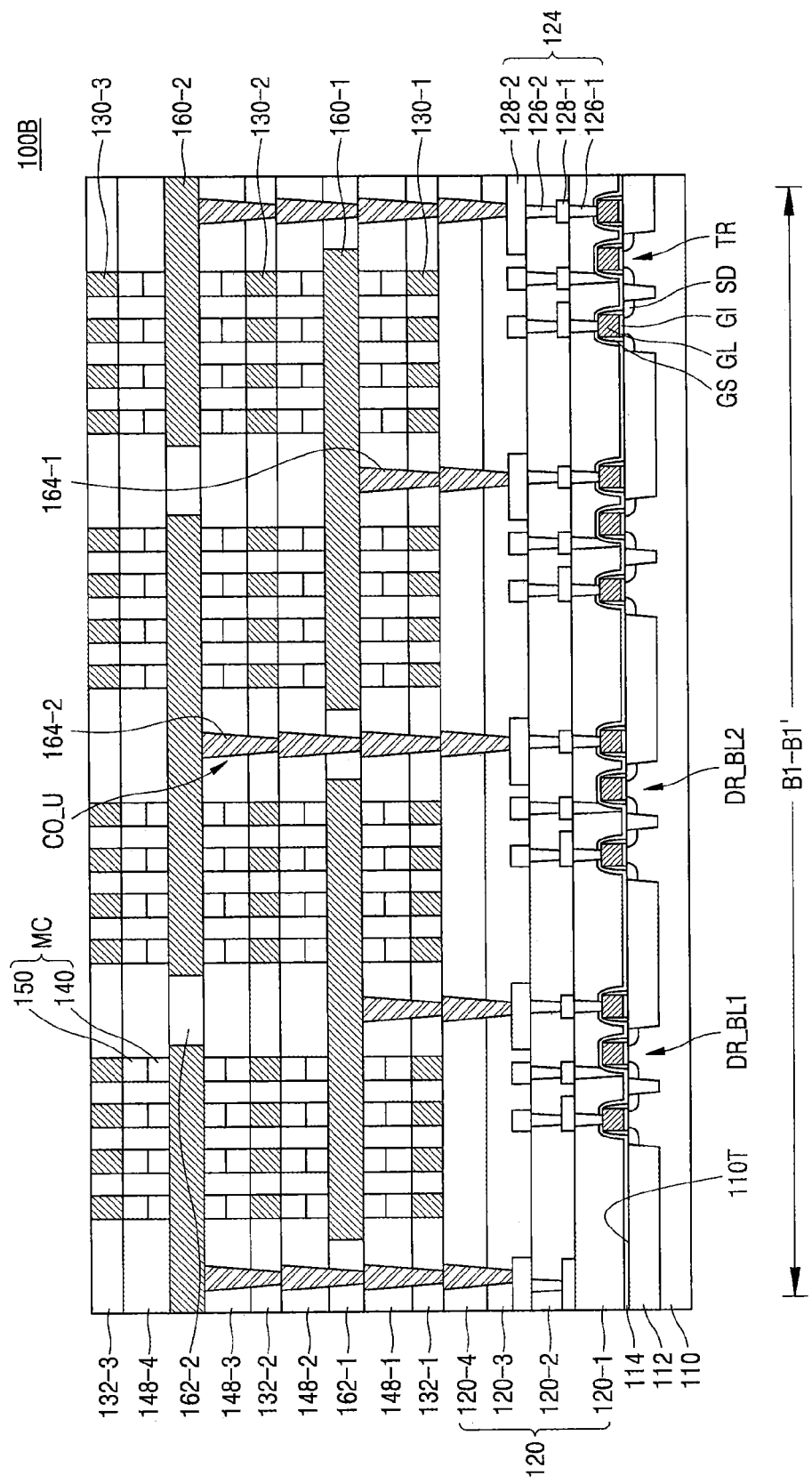
FIG. 16 is a cross-sectional view of a memory device according to example embodiments of the inventive concept.

FIG. 16 is a cross-sectional view of a memory device 100B according to example embodiments of the inventive concept. FIG. 16 shows a cross-section corresponding to the cross-sectional view taken along line B1-B1' of FIGS. 4 to 7. In FIGS. 1 to 16, like reference numerals denote like elements.

Referring to FIG. 16, each of the first and second bit line contacts 164-1 and 164-2 may include a plurality of studs CO_U. For example, the first bit line contact 164-1 may have a stacked structure of a stud CO_U surrounded by the interlayer insulating layer 120 and a stud CO_U surrounded by the first and second insulating layers 132-1 and 148-1. The second bit line contact 164-2 may have a stacked structure of a stud CO_U surrounded by the interlayer insulating layer 120, a stud CO_U surrounded by the first and second insulating layers 132-1 and 148-1, a stud CO_U surrounded by the third and fourth insulating layers 162-1 and 148-2, and a stud CO_U surrounded by the fifth and sixth insulating layers 132-2 and 148-3.

Although not shown in FIG. 16, the first word line contacts 134-1 (see FIG. 8), the second word line contacts 134-2 (see FIG. 8), and the third word line contacts 134-3 (see FIG. 8) may also have a stacked structure of a plurality of studs CO_U.

Figure 17:
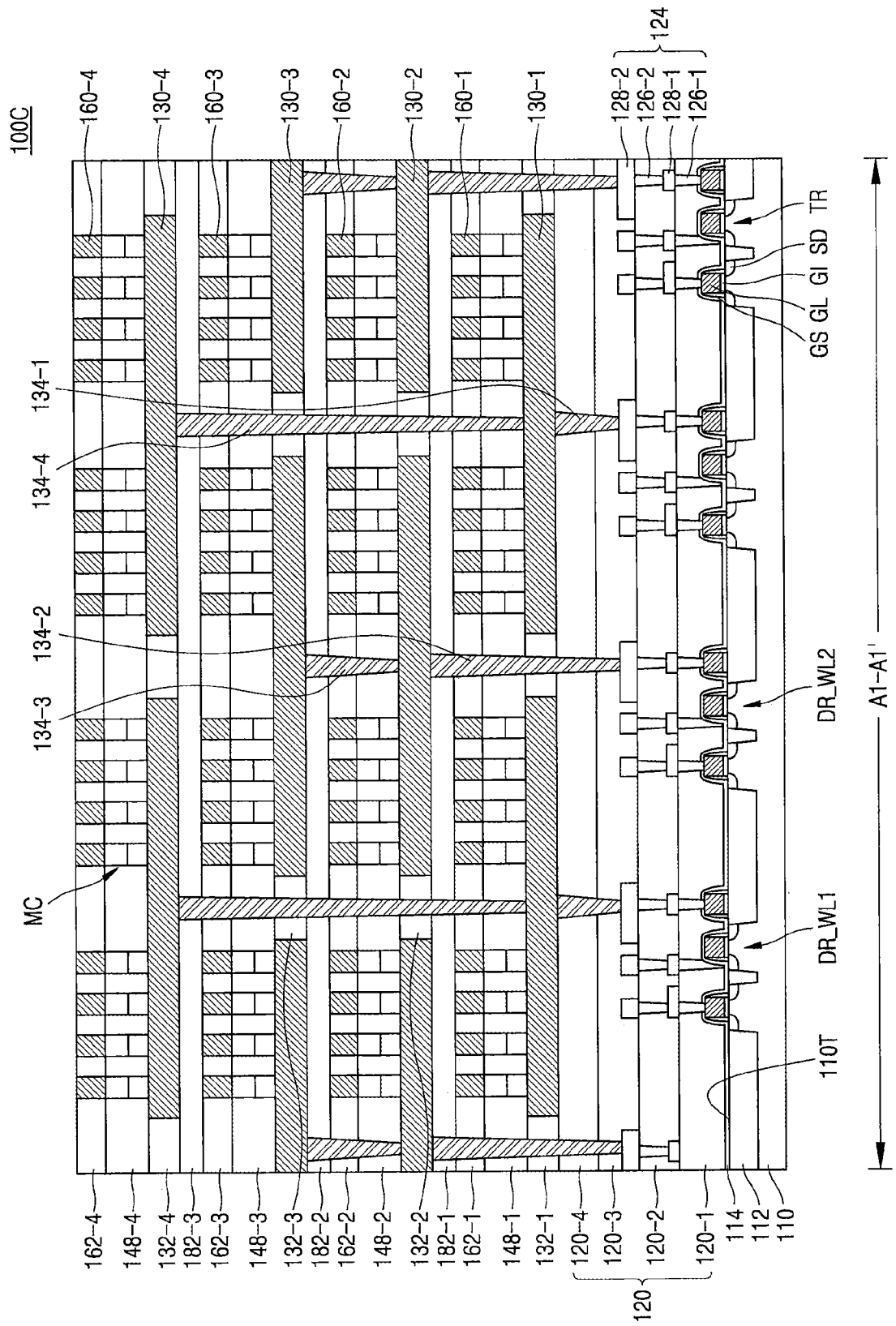
FIGS. 17 and 18 are cross-sectional views of a memory device according to example embodiments of the inventive concept.
Figure 18:
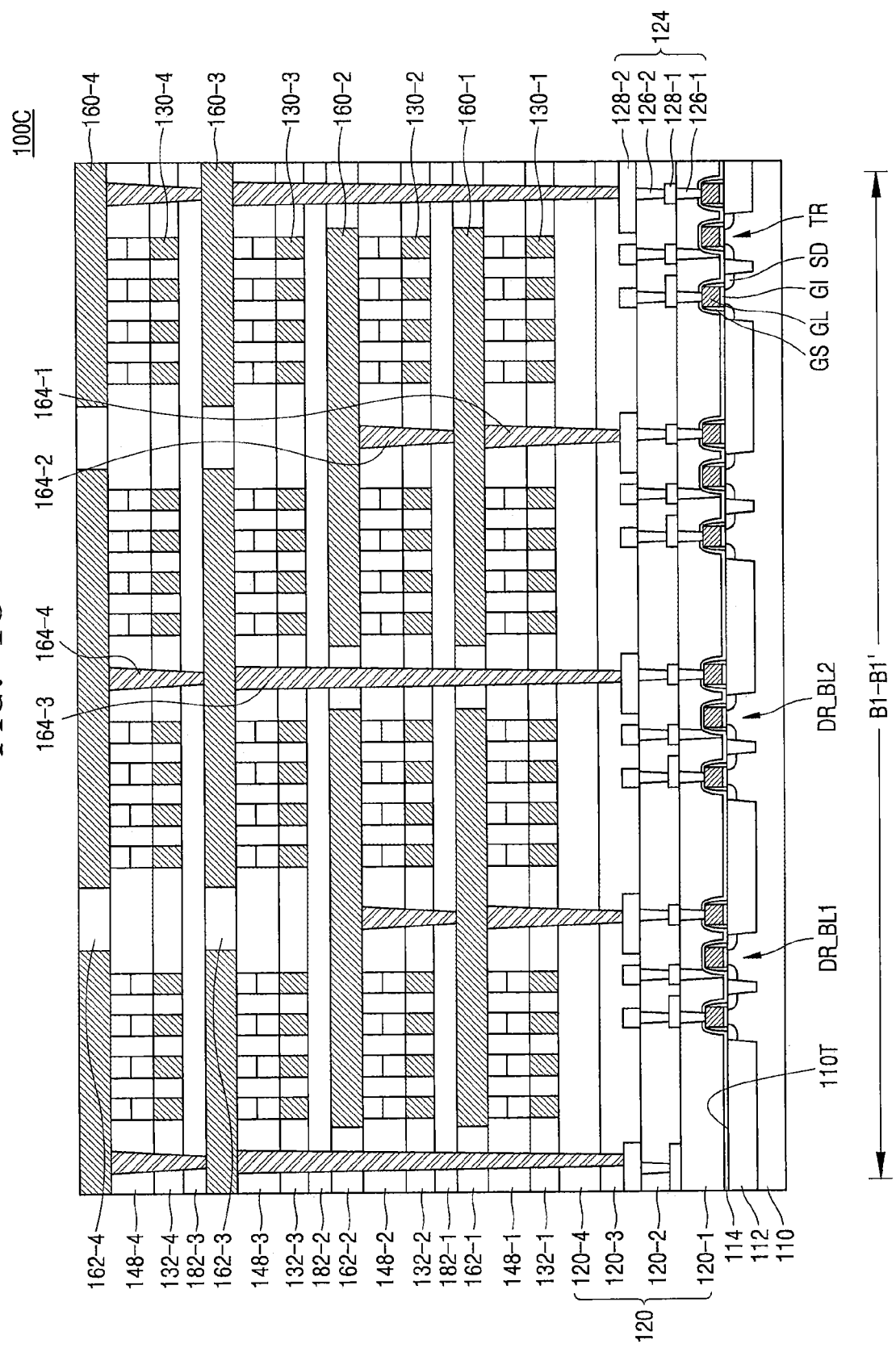

FIGS. 17 and 18 are cross-sectional views of a memory device 100C according to example embodiments of the inventive concept. FIG. 17 shows a cross-section corresponding to the cross-sectional view taken along line A1-A1' of FIGS. 4 to 7, and FIG. 18 shows a cross-section corresponding to the cross-sectional view taken along line B1-B1' of FIGS. 4 to 7. In FIGS. 1 to 18, like reference numerals denote like elements.

Referring to FIGS. 17 and 18, a plurality of first word lines 130-1, a plurality of second word lines 130-2, a plurality of third word lines 130-3, and a plurality of fourth word lines 130-4, which extend in a first direction (e.g., the X direction), and a plurality of first bit lines 160-1, a plurality of second bit lines 160-2, a plurality of third bit lines 160-3, and a plurality of fourth bit lines 160-4, which extend in a second direction (e.g., the Y direction), may be provided on the substrate 110 at different levels.

The memory cells MC may be provided between the first word lines 130-1 and the first bit lines 160-1, between the second word lines 130-2 and the second bit lines 160-2, between the third word lines 130-3 and the third bit lines 160-3, and between the fourth word lines 130-4 and the fourth bit lines 160-4.

The first word lines 130-1 may vertically overlap with the fourth word lines 130-4, and first word line contacts 134-1 separately connected to the first word lines 130-1 may be electrically connected to fourth word line contacts 134-4, which are separately connected to the fourth word lines 130-4. The second word lines 130-2 may vertically overlap with the third word lines 130-3, and second word line contacts 134-2 separately connected to the second word lines 130-2 may be electrically connected to third word line contacts 134-3, which are separately connected to the third word lines 130-3.

The first bit lines 160-1 may vertically overlap with the second bit lines 160-2, and first bit line contacts 164-1 separately connected to the first bit lines 160-1 may be electrically connected to second bit line contacts 164-2, which are separately connected to the second bit lines 160-2. The third bit lines 160-3 may vertically overlap with the fourth bit lines 160-4, and third bit line contacts 164-3 separately connected to the third bit lines 160-3 may be electrically connected to fourth bit line contacts 164-4, which are separately connected to the fourth bit lines 160-4.

Interlayer insulating layers 182-1, 182-2, and 182-3 may be further provided between the first bit lines 160-1 and the second word lines 130-2, between the second bit lines 160-2 and the third word lines 130-3, and between the third bit lines 160-3 and the fourth word lines 130-4.

Figure 19:
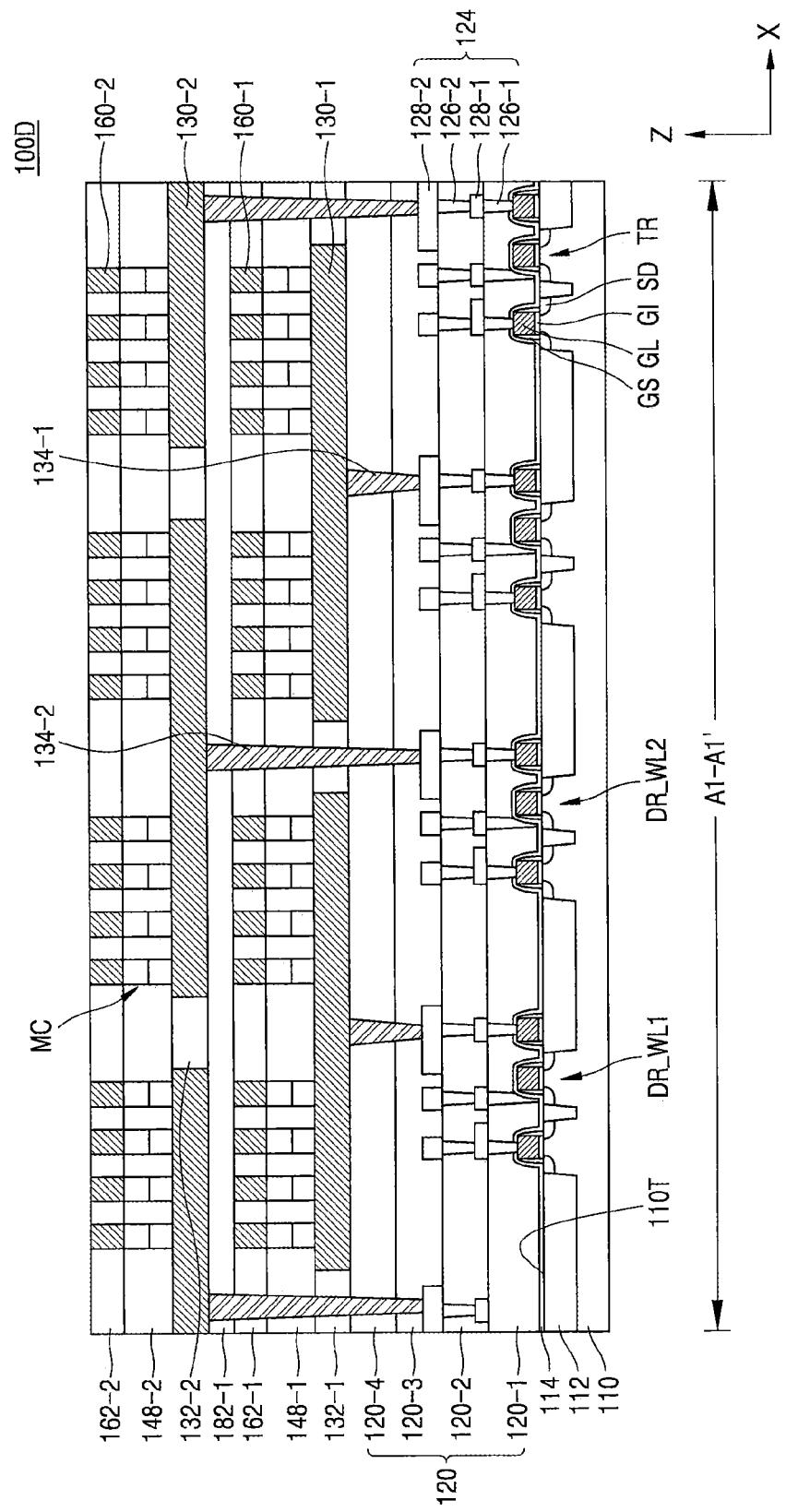
FIGS. 19 and 20 are cross-sectional views of a memory device according to further example embodiments of the inventive concept.
Figure 20:
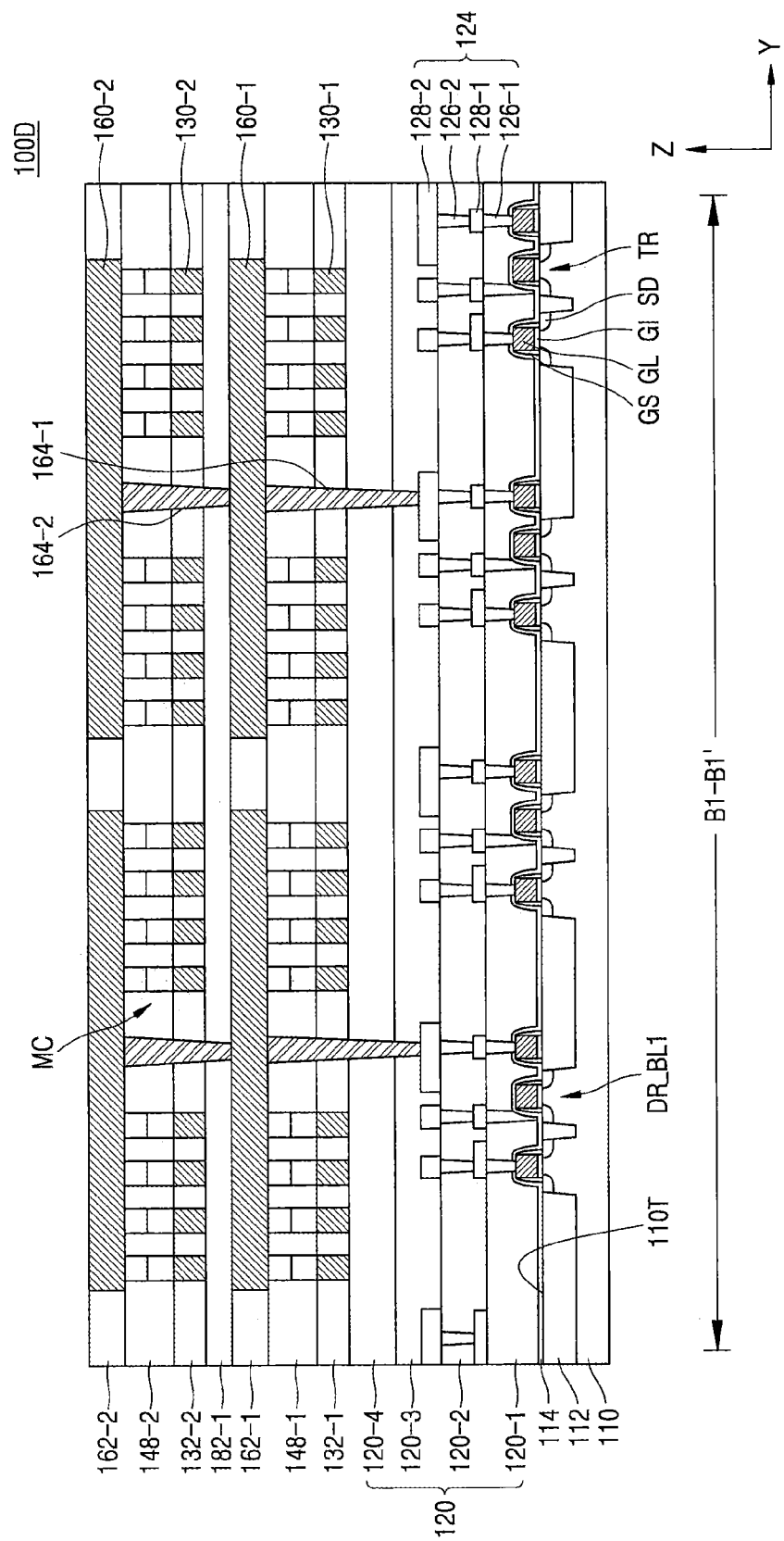

FIGS. 19 and 20 are cross-sectional views of a memory device 100D according to further example embodiments of the inventive concept. FIG. 19 shows a cross-section corresponding to the cross-sectional view taken along line A1-A1' of FIGS. 4 and 5, and FIG. 20 shows a cross-section corresponding to the cross-sectional view taken along line B1-B1' of FIGS. 4 and 5.

Referring to FIGS. 19 and 20, the first word lines 130-1 may extend on the substrate 110 in a first direction (e.g., the X direction of FIG. 19), and the first bit lines 160-1 may extend on the first word lines 130-1 in a second direction (e.g., the Y direction of FIG. 20). The second word lines 130-2 may extend on the first bit lines 160-1 in the first direction, and be shifted or offset from the first word lines 130-1 in the first direction by ½ of the first width W1 (see FIG. 2B). The second bit lines 160-2 may extend on the second word lines 130-2 in the second direction, and vertically overlap with the first bit lines 160-1.

The second bit lines 160-2 may be separately and electrically connected to the first bit lines 160-1 through the second bit line contacts 164-2, and the first bit lines 160-1 may be separately and electrically connected to the first bit line driving region DR_BL1 through the first bit line contacts 164-1.

According to the afore-described example embodiments, because the first and second word line contacts 134-1 and 134-2 and the first and second bit line contacts 164-1 and 164-2 are connected to center points of the first and second word lines 130-1 and 130-2 and the first and second bit lines 160-1 and 160-2, a wiring connection structure having a reduced or minimum length from the first and second word lines 130-1 and 130-2 and the first and second bit lines 160-1 and 160-2 to the driving circuit region DR (see FIG. 2B)

may be obtained. Therefore, the memory device 100D may have a relatively compact size. In addition, because the first and second word line contacts 134-1 and 134-2 and the first and second bit line contacts 164-1 and 164-2 are connected to center points of the first and second word lines 130-1 and 130-2 and the first and second bit lines 160-1 and 160-2, a difference or deviation in electrical characteristics of the memory cells MC based on locations thereof may be reduced.

Figure 21:
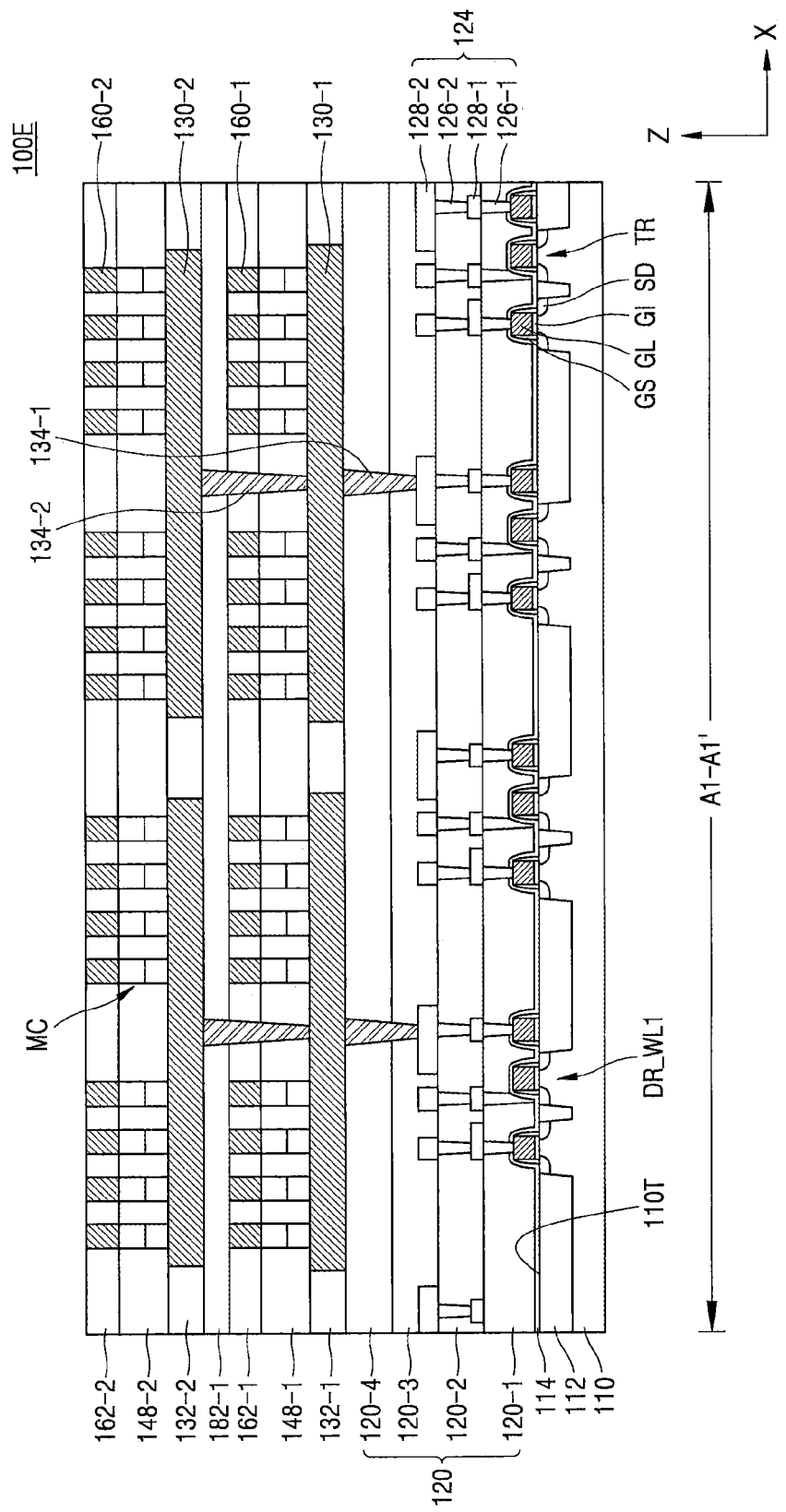
FIGS. 21 and 22 are cross-sectional views of a memory device according to further example embodiments of the inventive concept.
Figure 22:
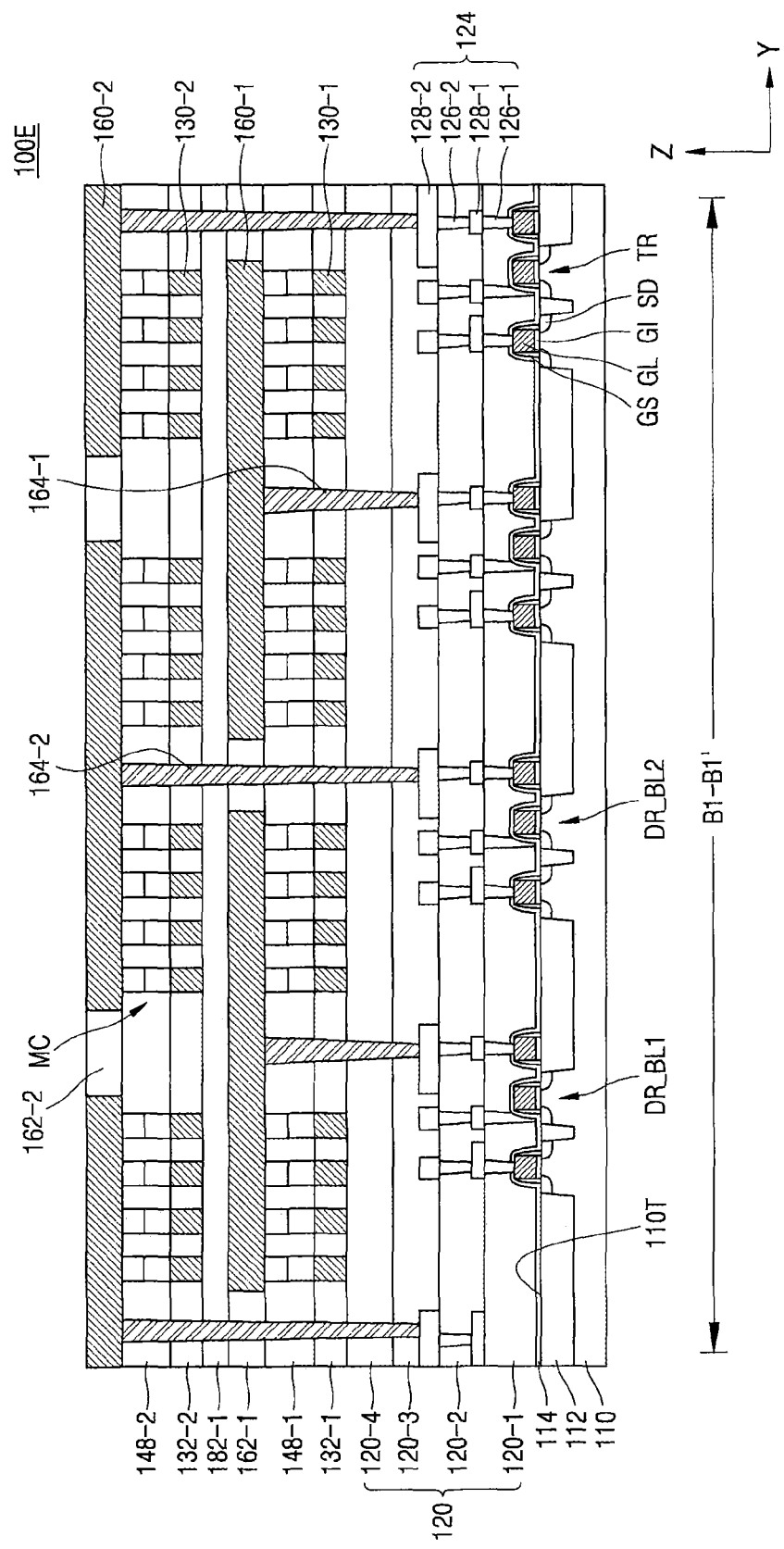

FIGS. 21 and 22 are cross-sectional views of a memory device 100E according to further example embodiments of the inventive concept. FIG. 21 shows a cross-section corresponding to the cross-sectional view taken along line A1-A1' of FIGS. 4 and 5, and FIG. 22 shows a cross-section corresponding to the cross-sectional view taken along line B1-B1' of FIGS. 4 and 5.

Referring to FIGS. 21 and 22, the first word lines 130-1 may extend on the substrate 110 in a first direction (e.g., the X direction of FIG. 21), and the first bit lines 160-1 may extend on the first word lines 130-1 in a second direction (e.g., the Y direction of FIG. 22). The second word lines 130-2 may extend on the first bit lines 160-1 in the first direction, and vertically overlap with the first word lines 130-1. The second bit lines 160-2 may extend on the second word lines 130-2 in the second direction, and be shifted or offset from the first bit lines 160-1 in the second direction by ½ of the second width W2 (see FIG. 2C).

The second word lines 130-2 may be separately and electrically connected to the first word lines 130-1 through the second word line contacts 134-2, and the first word lines 130-1 may be separately and electrically connected to the first word line driving region DR_WL1 through the first word line contacts 134-1.

According to the afore-described example embodiments, because the first and second word line contacts 134-1 and 134-2 and the first and second bit line contacts 164-1 and 164-2 are connected to center points of the first and second word lines 130-1 and 130-2 and the first and second bit lines 160-1 and 160-2, a wiring connection structure having a reduced or minimum length from the first and second word lines 130-1 and 130-2 and the first and second bit lines 160-1 and 160-2 to the driving circuit region DR (see FIG. 2C) may be obtained. Therefore, the memory device 100E may have a relatively compact size. In addition, because the first and second word line contacts 134-1 and 134-2 and the first and second bit line contacts 164-1 and 164-2 are connected to center points of the first and second word lines 130-1 and 130-2 and the first and second bit lines 160-1 and 160-2, a difference or deviation in electrical characteristics of the memory cells MC based on locations thereof may be reduced.

While the inventive concept has been particularly shown and described with reference to embodiments thereof, it will be understood that various changes in form and details may be made therein without departing from the spirit and scope of the following claims.

What is claimed is:

1. A memory device comprising:
a vertical stack including a plurality of first conductive lines, a plurality of first pillar structures disposed on the plurality of first conductive lines, a plurality of second conductive lines disposed on the plurality of first pillar structures, a plurality of second pillar structures disposed on the plurality of second conductive lines, a plurality of third conductive lines disposed on the plurality of second pillar structures, a plurality of third pillar structures disposed on the plurality of third conductive lines, a plurality of fourth conductive lines disposed on the plurality of third pillar structures, a plurality of fourth pillar structures disposed on the plurality of fourth conductive lines, and a plurality of fifth conductive lines disposed on the plurality of fourth pillar structures; and
a plurality of contacts configured to provide electrical connections between the plurality of first conductive lines and the plurality of fifth conductive lines,
wherein each of the plurality of first pillar structures, the plurality of second pillar structures, the plurality of third pillar structures and the plurality of fourth pillar structures includes a memory cell,
the plurality of first conductive lines, the plurality of third conductive lines and the plurality of fifth conductive lines laterally extend along a first horizontal direction, and
the plurality of second conductive lines and the plurality of fourth conductive lines laterally extend along a second horizontal direction.

2. The memory device of claim 1, wherein the plurality of first conductive lines have a first pitch along the second horizontal direction that is perpendicular to the first horizontal direction.

3. The memory device of claim 1, wherein the plurality of contacts are arranged in rows that extend along the second horizontal direction and are laterally spaced apart along the first horizontal direction.

4. The memory device of claim 3, wherein each row of the plurality of contacts includes a respective subset of the plurality of contacts that are arranged along the second horizontal direction with a second pitch.

5. The memory device of claim 1, wherein the plurality of first pillar structures include a variable resistance material layer.

6. The memory device of claim 1, wherein the plurality of first pillar structures include a first periodic rectangular two-dimensional array of first memory cells, and
the plurality of second pillar structures include a second periodic rectangular two-dimensional array of second memory cells having the same two-dimensional periodicity as the plurality of first pillar structures.

7. The memory device of claim 1, wherein each of the plurality of first pillar structures and the plurality of second pillar structures includes at least one vertical or tapered sidewall that vertically extends from a topmost surface thereof to a bottommost surface thereof.

8. The memory device of claim 1, wherein each of the plurality of first pillar structures and the plurality of second pillar structures includes a series connection of a variable resistance portion and a switching material portion.

9. The memory device of claim 8, wherein the variable resistance portion includes a phase change material, and
the switching material portion includes an Ovonic threshold switching (OTS) material.

10. The memory device of claim 1, wherein the plurality of first pillar structures is formed in a first insulating layer that laterally surrounds a lower portion of each of the plurality of contacts.

11. A method of forming a memory device, comprising:
forming a vertical stack over a substrate, the vertical stack including a plurality of first conductive lines, a plurality of first pillar structures disposed on the plurality of first conductive lines, a plurality of second conductive lines disposed on the plurality of first pillar structures, a plurality of second pillar structures disposed on the plurality of second conductive lines, a plurality of third conductive lines disposed on the plurality of second pillar structures, a plurality of third pillar structures disposed on the plurality of third conductive lines, a plurality of fourth conductive lines disposed on the plurality of third pillar structures and a plurality of fourth pillar structures disposed on the plurality of fourth conductive lines, forming a plurality of contact structures, each of the plurality of contact structures contacting a corresponding one of the plurality of first conductive lines; and forming a plurality of fifth conductive lines on the plurality of fourth pillar structure and the plurality of contact structures, wherein each of the plurality of first pillar structures, the plurality of second pillar structures, the plurality of third pillar structures and the plurality of fourth pillar structures includes a memory cell and is embedded within an insulating layer, the plurality of contact structures are disposed through the insulating layer, and each of the plurality of contact structures contacts a corresponding one of the plurality of fifth conductive lines.

12. The method of claim 11, further comprising:
forming a first insulating layer around the plurality of first pillar structures; and
forming a second insulating layer around the plurality of second pillar structures,
wherein the plurality of contact structures are formed through the first insulating layer and the second insulating layer.

13. The method of claim 11, wherein the plurality of first conductive lines, the plurality of third conductive lines and the plurality of fifth conductive lines laterally extend along a first horizontal direction, and
the plurality of second conductive lines and the plurality of fourth conductive lines laterally extend along a second horizontal direction that is perpendicular to the first horizontal direction.

14. The method of claim 13, wherein the plurality of first conductive lines have a first pitch along the second horizontal direction, and
the plurality of contact structures are arranged in rows that extend along the second horizontal direction and are laterally spaced apart along the first horizontal direction.

15. The method of claim 11, further comprising:
forming a memory stack on the plurality of first conductive lines;
forming a mask pattern on the memory stack;
forming a spacer on the memory stack; and
performing an anisotropic etching process on the memory stack using the mask pattern as an etching mask.

16. The method of claim 11, wherein each of the plurality of first pillar structures and the plurality of second pillar structures includes a series connection of a variable resistance portion and a switching material portion,
the variable resistance portion that includes a phase change material, and
the switching material portion includes an Ovonic threshold switching (OTS) material.

17. The method of claim 11, wherein the plurality of first pillar structures is formed in a first insulating layer that laterally surrounds a lower portion of each of the plurality of contact structures.

18. A memory device comprising:
a substrate;
a plurality of first conductive lines disposed on the substrate and extending along a first direction;
a first insulating layer filling space between two adjacent first conductive lines among the plurality of first conductive lines;
a plurality of first pillar structures disposed on the plurality of first conductive lines and the first insulating layer;
a second insulating layer filling space between two adjacent first pillar structures among the plurality of first pillar structures;
a plurality of second conductive lines disposed on the plurality of first pillar structures and the second insulating layers, and extending along a second direction that is substantially perpendicular to the first direction;
a third insulating layer filling space between two adjacent second conductive lines among the plurality of second conductive lines;
a plurality of second pillar structures disposed on the plurality of second conductive lines and the third insulating layer;
a fourth insulating layer filling space between two adjacent second pillar structures among the plurality of second pillar structures;
a plurality of third conductive lines disposed on the plurality of second pillar structures and the plurality of fourth insulating layer, and extending along the first direction;
a fifth insulating layer filling space between two adjacent third conductive lines among the plurality of third conductive lines;
a plurality of third pillar structures disposed on the plurality of third conductive lines and the fifth insulating layer;
a sixth insulating layer filling space between two adjacent third pillar structures among the plurality of third pillar structures;
a plurality of fourth conductive lines disposed on the plurality of third pillar structures and the sixth insulating layer, and extending along the second direction;
a seventh insulating layer filling space between two adjacent fourth conductive lines among the plurality of fourth conductive lines;
a plurality of fourth pillar structures disposed on the plurality of fourth conductive lines and the seventh insulating layer;
an eighth insulating layer filling space between two adjacent fourth pillar structures among the plurality of fourth pillar structures;
a plurality of fifth conductive lines disposed on the plurality of fourth pillar structures and the eighth insulating layer, and extending along the first direction;
a ninth insulating layer filling space between two adjacent fifth conductive lines among the plurality of fifth conductive lines; and
a plurality of contact structures penetrating the second insulating layer, the third insulating layer, the fourth insulating layer, the fifth insulating layer, the sixth insulating layer, the seventh insulating layer and the eighth insulating layer, and configured to provide electrical connections between the plurality of first conductive lines and the plurality of fifth conductive lines,
wherein each of the plurality of first pillar structures, the plurality of second pillar structures, the plurality of third pillar structures and the plurality of fourth pillar structures includes a memory cell.

19. The memory device of claim 18, wherein each of the plurality of first pillar structures includes a variable resistance material layer.

20. The memory device of claim 18, wherein each of the plurality of first pillar structures and the plurality of second pillar structures includes a series connection of a variable resistance portion and a switching material portion, the variable resistance portion that includes a phase change material, and the switching material portion includes an Ovonic threshold switching (OTS) material.

* * * * *